United States Patent
Parish et al.

(10) Patent No.: US 7,857,037 B2
(45) Date of Patent: Dec. 28, 2010

(54) GEOMETRICALLY REORIENTED LOW-PROFILE PHASE PLANE HEAT PIPES

(75) Inventors: Overton L. Parish, Frisco, TX (US); Tony Quisenberry, Highland Village, TX (US); Clark R. Havis, Roundrock, TX (US)

(73) Assignee: Thermotek, Inc., Flower Mound, TX (US)

( * ) Notice: Subject to any disclaimer, the term of this patent is extended or adjusted under 35 U.S.C. 154(b) by 1071 days.

(21) Appl. No.: 10/998,199

(22) Filed: Nov. 26, 2004

(65) Prior Publication Data

US 2005/0284615 A1   Dec. 29, 2005
US 2009/0277613 A9   Nov. 12, 2009

Related U.S. Application Data

(63) Continuation-in-part of application No. 10/305,662, filed on Nov. 26, 2002, now Pat. No. 6,834,712.

(60) Provisional application No. 60/525,242, filed on Nov. 25, 2003, provisional application No. 60/334,235, filed on Nov. 27, 2001.

(51) Int. Cl.
*F28D 15/00* (2006.01)
(52) U.S. Cl. .............. 165/104.33; 165/104.21; 165/104.26
(58) Field of Classification Search ............ 165/104.21, 165/104.26, 104.33
See application file for complete search history.

(56) References Cited

U.S. PATENT DOCUMENTS

| | | |
|---|---|---|
| 3,528,494 A | 9/1970 | Levedahl |
| 3,834,171 A | 9/1974 | Johansson |
| 4,072,188 A | 2/1978 | Wilson et al. |
| 4,125,122 A | 11/1978 | Stachurski |
| 4,196,504 A | 4/1980 | Eastman |
| 4,279,294 A | 7/1981 | Fitzpatrick et al. |
| 4,280,519 A | 7/1981 | Chapman |
| 4,345,642 A | 8/1982 | Ernst et al. |
| 4,375,157 A | 3/1983 | Boesen |
| 4,381,032 A | 4/1983 | Cutchaw |
| 4,448,028 A | 5/1984 | Chao et al. |

(Continued)

FOREIGN PATENT DOCUMENTS

DE     1284506     12/1968

(Continued)

OTHER PUBLICATIONS

Andre Ali et al.; "Advanced Heat Pipe Thermal Solutions for Higher Power Notebook Computers"; Intel Corporation, Santa Clara, CA 1999; Thermacore, Inc. Lancaster, PA 1999; 6 pages.

(Continued)

*Primary Examiner*—Ljiljana (Lil) V Ciric
(74) *Attorney, Agent, or Firm*—Winstead PC

(57) ABSTRACT

A cooling system for removing heat from at least one heat generating component with a first low-profile phase plane heat pipe having a geometrically reoriented surface adapted for receiving heat from the at least one heat generating component along a first section of the geometrically reoriented surface, and having a plurality of micro-tubes disposed therein. A heat transfer fluid is contained with the plurality of micro-tubes and a second section of the geometrically reoriented heat pipe surface is disposed in a position geometrically offset from the first section.

21 Claims, 17 Drawing Sheets

U.S. PATENT DOCUMENTS

| | | |
|---|---|---|
| 4,470,450 A | 9/1984 | Bizzell et al. |
| 4,493,308 A | 1/1985 | Hurley et al. |
| 4,503,906 A | 3/1985 | Andres et al. |
| 4,513,732 A | 4/1985 | Feldman, Jr. |
| 4,550,774 A | 11/1985 | Andres et al. |
| 4,558,395 A | 12/1985 | Yamada et al. |
| 4,562,955 A | 1/1986 | Horster et al. |
| 4,640,347 A | 2/1987 | Grover et al. |
| 4,675,783 A | 6/1987 | Murase et al. |
| 4,686,961 A | 8/1987 | Garrison |
| 4,729,060 A | 3/1988 | Yamamoto et al. |
| 4,802,929 A | 2/1989 | Schock |
| 4,830,100 A | 5/1989 | Kato et al. |
| 4,854,377 A | 8/1989 | Komoto et al. |
| 4,880,052 A | 11/1989 | Meyer, IV et al. |
| 4,880,053 A | 11/1989 | Sheyman |
| 4,884,630 A | 12/1989 | Nelson et al. |
| 4,896,716 A | 1/1990 | Sotani et al. |
| 4,909,315 A | 3/1990 | Nelson et al. |
| 4,921,041 A | 5/1990 | Akachi |
| 4,982,274 A | 1/1991 | Murase et al. |
| 5,002,122 A | 3/1991 | Sarraf et al. |
| 5,005,640 A | 4/1991 | Lapinski et al. |
| 5,029,389 A | 7/1991 | Tanzer |
| 5,036,384 A | 7/1991 | Umezawa |
| 5,038,569 A | 8/1991 | Shirota et al. |
| 5,044,429 A | 9/1991 | Sakaya et al. |
| 5,054,296 A | 10/1991 | Sotani et al. |
| 5,069,274 A | 12/1991 | Haslett et al. |
| 5,076,351 A | 12/1991 | Munekawa et al. |
| 5,084,966 A | 2/1992 | Murase |
| 5,099,311 A | 3/1992 | Bonde et al. |
| 5,133,492 A | 7/1992 | Wohrstein et al. |
| 5,139,546 A | 8/1992 | Novobilski |
| 5,159,529 A | 10/1992 | Lovgren et al. |
| 5,168,921 A | 12/1992 | Meyer, IV |
| 5,186,252 A | 2/1993 | Nishizawa et al. |
| 5,199,487 A | 4/1993 | DiFrancesco et al. |
| 5,203,399 A | 4/1993 | Koizumi |
| 5,207,674 A | 5/1993 | Hamilton |
| 5,220,171 A | 6/1993 | Hara et al. |
| 5,268,812 A | 12/1993 | Conte |
| 5,283,464 A | 2/1994 | Murase |
| 5,283,715 A | 2/1994 | Carlsten et al. |
| 5,285,347 A | 2/1994 | Fox et al. |
| 5,314,010 A | 5/1994 | Sakaya et al. |
| 5,316,077 A | 5/1994 | Reichard |
| 5,336,128 A | 8/1994 | Birdsong |
| 5,342,189 A | 8/1994 | Inamura et al. |
| 5,353,639 A | 10/1994 | Brookins et al. |
| 5,355,942 A | 10/1994 | Conte |
| 5,388,635 A | 2/1995 | Gruber et al. |
| 5,404,938 A | 4/1995 | Dinh |
| 5,409,055 A | 4/1995 | Tanaka et al. |
| 5,465,780 A | 11/1995 | Muntner et al. |
| 5,465,782 A | 11/1995 | Sun et al. |
| 5,535,816 A | 7/1996 | Ishida |
| 5,544,698 A | 8/1996 | Paulman |
| 5,555,622 A | 9/1996 | Yamamoto et al. |
| 5,567,493 A | 10/1996 | Imai et al. |
| 5,598,632 A | 2/1997 | Camarda et al. |
| 5,615,086 A | 3/1997 | Collins et al. |
| 5,636,684 A | 6/1997 | Teytu et al. |
| 5,642,775 A | 7/1997 | Akachi |
| 5,647,430 A | 7/1997 | Tajima |
| 5,651,414 A | 7/1997 | Suzuki et al. |
| 5,653,111 A | 8/1997 | Attey et al. |
| 5,660,229 A | 8/1997 | Lee et al. |
| 5,666,819 A | 9/1997 | Rockenfeller et al. |
| 5,675,473 A | 10/1997 | McDunn et al. |
| 5,682,748 A | 11/1997 | DeVilbiss et al. |
| 5,689,957 A | 11/1997 | DeVilbiss et al. |
| 5,690,849 A | 11/1997 | DeVilbiss et al. |
| 5,692,558 A | 12/1997 | Hamilton et al. |
| 5,697,428 A | 12/1997 | Akachi |
| 5,711,155 A | 1/1998 | DeVilbiss et al. |
| 5,727,619 A | 3/1998 | Yao et al. |
| 5,729,995 A | 3/1998 | Tajima |
| 5,731,954 A | 3/1998 | Cheon |
| 5,737,186 A | 4/1998 | Fuesser et al. |
| 5,890,371 A | 4/1999 | Rajasubramanian et al. |
| 5,896,917 A | 4/1999 | Lemont et al. |
| 5,901,037 A | 5/1999 | Hamilton et al. |
| 5,901,040 A | 5/1999 | Cromwell et al. |
| 5,960,866 A | 10/1999 | Kimura et al. |
| 5,989,285 A | 11/1999 | DeVilbiss et al. |
| 6,026,890 A | 2/2000 | Akachi |
| 6,032,726 A | 3/2000 | Wright et al. |
| 6,041,850 A | 3/2000 | Esser et al. |
| 6,058,712 A | 5/2000 | Rajasubramanian et al. |
| 6,072,697 A | 6/2000 | Garcia-Ortiz |
| 6,101,715 A | 8/2000 | Fuesser et al. |
| 6,148,906 A | 11/2000 | Li et al. |
| 6,293,333 B1 | 9/2001 | Ponnappan et al. |
| 6,302,192 B1 | 10/2001 | Dussinger et al. |
| 6,315,033 B1 | 11/2001 | Li |
| 6,394,175 B1 | 5/2002 | Chen et al. |
| 6,397,935 B1 | 6/2002 | Yamamoto et al. |
| 6,439,298 B1 | 8/2002 | Li |
| 6,457,515 B1 | 10/2002 | Vafai et al. |
| 6,462,949 B1 | 10/2002 | Parish, IV et al. |
| 6,523,259 B1 | 2/2003 | Pinneo |
| 6,647,625 B2 | 11/2003 | Wang et al. |
| 6,679,316 B1 | 1/2004 | Lin et al. |
| 6,698,502 B1 | 3/2004 | Lee |
| 6,745,825 B1 | 6/2004 | Nakamura et al. |
| 6,795,310 B2 | 9/2004 | Ghosh |
| 6,810,946 B2 | 11/2004 | Hoang |
| 6,820,684 B1 | 11/2004 | Chu et al. |
| 6,828,675 B2 | 12/2004 | Memory et al. |
| 6,834,712 B2 | 12/2004 | Parish et al. |
| 6,935,409 B1 | 8/2005 | Parish, IV et al. |
| 6,988,315 B2 * | 1/2006 | Parish et al. ............ 165/104.33 |
| 7,150,312 B2 * | 12/2006 | Parish et al. ............ 165/104.33 |
| 7,322,400 B2 * | 1/2008 | Parish et al. ............ 165/104.21 |
| 2002/0189793 A1 | 12/2002 | Noda et al. |
| 2003/0089486 A1 | 5/2003 | Parish et al. |
| 2003/0089487 A1 | 5/2003 | Parish, IV et al. |
| 2003/0127215 A1 | 7/2003 | Parish, IV et al. |
| 2004/0099407 A1 | 5/2004 | Parish, IV et al. |
| 2004/0112572 A1 | 6/2004 | Moon et al. |
| 2004/0177947 A1 | 9/2004 | Krassowski et al. |
| 2005/0006061 A1 | 1/2005 | Quisenberry et al. |
| 2005/0039887 A1 | 2/2005 | Parish, IV et al. |
| 2005/0056403 A1 | 3/2005 | Norlin et al. |
| 2006/0137181 A1 | 6/2006 | Parish et al. |
| 2008/0110597 A1 | 5/2008 | Parish, IV et al. |

FOREIGN PATENT DOCUMENTS

| | | |
|---|---|---|
| DE | 3117758 | 1/1982 |
| DE | 8512617 | 9/1985 |
| DE | 19849919 | 5/1999 |
| GB | 334209 | 8/1930 |
| GB | 1402509 | 8/1975 |
| GB | 2128319 A | 4/1984 |
| GB | 2128320 A | 4/1984 |
| GB | 2293446 | 3/1996 |
| JP | 53136749 | 11/1978 |
| JP | 63115351 | 5/1988 |
| JP | 6291481 | 10/1994 |
| SU | 589531 | 1/1978 |
| SU | 1476297 | 4/1989 |
| WO | WO 91/06958 | 5/1991 |

| | | |
|---|---|---|
| WO | WO-95/26125 | 9/1995 |
| WO | WO-98/20260 | 1/1998 |
| WO | WO-99/42781 | 8/1999 |
| WO | WO-00/70288 | 11/2000 |
| WO | WO-01/03484 | 1/2001 |
| WO | WO 02/080270 A1 * | 10/2002 |
| WO | WO 03/046463 A2 * | 6/2003 |

OTHER PUBLICATIONS

Thermalex, Inc; Setting a Higher Standard in Aluminum Extrusions; Brochure undated; 8 pages.

"Furukawa Electric Heat Planar"; Brochure undated from Trade Show, Aug. 1999; 4 pages.

"Gore's Polarchip Thermal Interface Materials . . . Bridge the Gap Between Hot PCBs and Cool Heat Sinks."; W.L. Gore and Associates, Inc. 2000; 1 page.

"Thermal Management Components to Fill Virtually Any Gap Configuration"; Stockewell Rubber Company; Nov. 2001.

U.S. Appl. No. 10/998,198, filed Nov. 26, 2004, Quisenberry et al.

* cited by examiner

GEOMETRICALLY REORIENTED LOW-PROFILE PHASE PLANE HEAT PIPES

CROSS-REFERENCES

This application claims priority to and incorporates by reference the entirety of U.S. Provisional Application Ser. No. 60/525,242, filed Nov. 25, 2003. This application is also a Continuation-In-Part of and incorporates by reference the entire disclosure of U.S. patent application Ser. No. 10/305,662, which was filed on Nov. 26, 2002, and issued as U.S. Pat. No. 6,834,712 on Dec. 28, 2004, which claims priority to U.S. Provisional Application Ser. No. 60/334,235 filed Nov. 27, 2001. The present application also incorporates by reference the entire disclosure of U.S. patent application Ser. No. 09/328,183, which was filed Jun. 8, 1999. Related applications include U.S. patent application Ser. No. 10/328,537 which is a divisional of the above-referenced patent application Ser. No. 09/328,183. Other related applications include U.S. patent application Ser. No. 10/328,438 which is also a divisional of U.S. patent application Ser. No. 09/328,183, and U.S. patent application Ser. No. 10/335,373, a continuation-in-part of referenced U.S. patent application Ser. No. 09/328,183.

BACKGROUND OF THE INVENTION

1. Field of the Invention

The present invention relates to methods of and systems for cooling and heating, and more particularly, but not by way of limitation, to a cooling and/or heating system incorporating geometrically reoriented or twisted low-profile extrusions (LPE).

2. History of Related Art

Many aspects of the technology of, and advances in, methods of and systems for cooling and heating utilizing heat pipes are well developed. A heat pipe is a device for transferring heat by means of heat transfer, including heat transfer through the evaporation and condensing cycle of a liquid enclosed in a casing from which noncondensable gasses have been removed. There are, of course, significant limitations on the amount of heat a heat pipe can transfer in a given time or in a given space. In that regard, special configurations are often major design aspects in dealing with heat pipes and/or other forms of heating and/or cooling systems. In the present application, particular emphasis will be placed on heating systems, but the application of heating and/or cooling application is contemplated relative to discussions herein.

The need for thermal stabilization of electronic components is well recognized in industry today. In that regard, LPE cooling devices are extremely useful in printed circuit board (PCB) level cooling of electronic components, and for use as heat exchangers in applications where space is limited and/or low weight is critical. LPE refers to a heat exchange apparatus comprising an integral piece of metal having a series of micro extruded hollow tubes formed therein for containing a fluid. LPE's preferably have multi-void micro extruded tubes designed to operate under the pressures and temperatures required by modern environmentally safe refrigeration gases and to resist corrosion. Aspects of LPE's and their related applications in the industry are set forth and shown in the above-referenced co-pending U.S. patent application Ser. No. 09/328,183.

Low profile extrusions can currently be manufactured with a profile, or height, as low as about 0.05 inches and with tubes of varying inner diameters. Of course, future advances may allow such low profile extrusions to be manufactured with an even smaller profile. Such low profile extrusions have been conventionally used in heat exchanger applications in the automotive industry, and are commercially available in strip form (having a generally rectangular geometry) or coil form (a continuous strip coiled for efficient transport).

An example low profile extrusions is described in a brochure entitled "Thermalex, Inc.—Setting A Higher Standard in Aluminum Extrusions" (hereinafter the "Thermalex Brochure") provides additional detail regarding the Thermalex low profile extrusions and is incorporated herein by reference.

U.S. Pat. No. 5,342,189 to Inamura, et al, which is incorporated herein by reference, provides additional detail regarding an extrusion die for making such low profile extrusions. The extrusion die is used for making multi-cavity flat aluminum tubes, which are used for small heat exchanger components, in automotive air-conditioners, condensers, and radiators. The insert die is composed of a male die section having a protrusion part and a female die section, having a die cavity, and is held detachably in a die holder. The male section is a roughly rectangular plate-shaped component, and has an integrally formed twist prevention region which is inserted into the receiver groove of the female section which is integrally formed thereon. The protrusion part defines the cavity shape of the multi-cavity flat tube, and the female section has the die cavity of the required cross sectional shape to define the outer shape of the tube.

U.S. Pat. No. 5,353,639 to Brookins, et al, which is incorporated herein by reference, provides additional detail regarding a method and apparatus for sizing a plurality of micro extruded tubes used in such low profile extrusions. As described by the Brookins patent, a predetermined number of micro extruded tubes are stacked on the base fence between the fixed side fence and the clamping fence. The internal webs of the tubes are aligned throughout the stack, perpendicular to the plane of the base fence. The clamping fence is moved toward the stack of tubes to prevent the stack from moving laterally. The die platen is moved toward the stack of tubes and the mating surface of the die platen is in mating engagement with a side surface of the uppermost tube in the stack. A predetermined amount of pressure is applied to the stack of tubes through the die platen. The pressure is applied equally across the entire side surface of the uppermost tube and is transmitted equally through all the tubes of the stack in the sizing die.

Other developments in cooling apparatus may be seen in U.S. Pat. No. 5,285,347 to Fox et al., which describes a hybrid cooling system for electrical components. A hybrid heat sink is specially adapted to transfer heat to two cooling fluids. This heat sink is incorporated into a cooling system in which some of the electronic components of an electronic device may be cooled by two cooling fluids and some electronic components may be cooled by one cooling fluid. The electronic components are mounted on a circuit board. In the Fox reference, one of the cooling fluids is air and one is a liquid. The hybrid heat sink is attached to electronic components that cannot be cooled to the normal operating range by the cooling air alone. The cooling air is caused to flow over the surface of the heat sink, removing some of the heat. In addition, the cooling liquid is caused to flow through the heat sink, thereby removing additional heat.

In addition, U.S. Pat. No. 5,901,037 to Hamilton, et al. describes a system for closed loop liquid cooling for semiconductor RF amplifier modules. The system comprises a combination of a plurality of elongated microchannels connected between a pair of coolant manifolds for conducting liquid coolant beneath the transistors to dissipate the heat generated thereby. The system also includes a heat exchanger, a miniature circulating pump located on the module, and passive check valves having tapered passages for controlling the flow of coolant in the loop. The valve comprises a truncated pyramid-shaped microchannel valve having no moving parts and is fabricated so as to be a part of either the circulating pump assembly, the coolant manifold, or the microchannels.

It has been shown that the use of LPE's greatly improves the efficiency of the heat removal process. Furthermore, it is disclosed in the above-referenced, co-pending U.S. application Ser. No. 10/328,537, U.S. patent application Ser. No. 09/328,183, U.S. patent application Ser. No. 10/328,438, and U.S. patent application Ser. No. 09/328,183, that heat pipes provide superior performance in a low-profile, light-weight package. It would be an advantage therefore, in tightly enclosed spaces, to provide a design incorporating a twisted or bent low-profile cooling system without additional manufacturing costs. These systems would facilitate the use of a heat pipe system in tight or cramped enclosures such as notebook computers or the like. For example, one embodiment of a heat pipe shaped into a torroidal configuration is set forth and shown in U.S. patent application Ser. No. 10/827,217 filed Apr. 19, 2004, incorporated herein in its entirety by reference. Special advantages are provided with a torroidal heat exchanger in view of the ability of the torroidal exchanger to be placed in a defined airflow as described therein. The torroidal configuration likewise includes fin stock secured to the outer surface of the heat pipe.

SUMMARY OF THE INVENTION

The present invention relates to an LPE system and method of manufacture. More particularly, embodiments of the present invention relate to geometrically reoriented, such as twisted or bent heat pipe configurations. One portion of the heat pipe functions as a condenser and the other portion functions as an evaporator. The condenser portion of the heat pipe system may be affixed to an enclosure for the transfer of heat outside the enclosure. The geometrically reoriented heat pipe facilitates positioning of the heat pipe in and among electronic components, such as those in a computer, for purposes of affording heat transfer in an otherwise "space or shape challenged" environment.

In another aspect, the heat pipe may have a fin stock secured to the outer surface of the geometrically reoriented heat pipe to improve the efficiency of the heat pipe system. The geometrically reoriented heat pipe configuration of the present invention provides many advantages, such as when used in enclosures having very little space in which to mount a heat removal device. Also, embodiments of the present invention may be advantageous in space or shape challenged enclosures requiring no fan ducts or cooling means flowing throughout the system. Moreover, embodiments of the present invention may be designed to operate with any number of heat transfer fluids such as water, glycol, fluorinated polyethers that are common in the semiconductor industry. A further advantage is that certain configurations may be utilized to remove heat from more than one heat generating component and may be positioned so gravity may assist in the heat removal process.

In another aspect, one embodiment of the present invention includes a cooling system for removing heat from at least one heat generating component, the cooling system comprising a phase plane heat pipe having a first portion in thermal contact with the at least one heat generating component, the heat pipe having a second geometrically reoriented portion extending therefrom, and having a plurality of micro-tubes, and a heat transfer fluid contained within the plurality of micro-tubes, wherein the heat transfer fluid is evaporated in the first portion and condensed in the second portion to facilitate the removal of heat.

In yet another aspect, one embodiment of the invention includes the second portion of the geometrically reoriented heat pipe extending from the first portion in a generally U-shaped configuration, or the second portion of the heat pipe extending from the first portion in a generally axially aligned twisted configuration. One embodiment further includes an array of cooling fins in thermal contact with at least one surface of the heat pipe and a thermally conductive spacer block disposed between the heat pipe and the at least one heat generating component.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION

The present invention may be better understood with reference to FIGS. 1-14, which illustrate low-profile extrusion apparatus' of the unstacked and stacked variety, the description being set forth for reference purposes. The embodiments are set forth, shown and described in more detail in the above referenced U.S. patent application Ser. No. 10/305,662. Embodiments according to the present invention are illustrated in FIGS. 15-18 and specifically discussed relative thereto.

Figure 1:
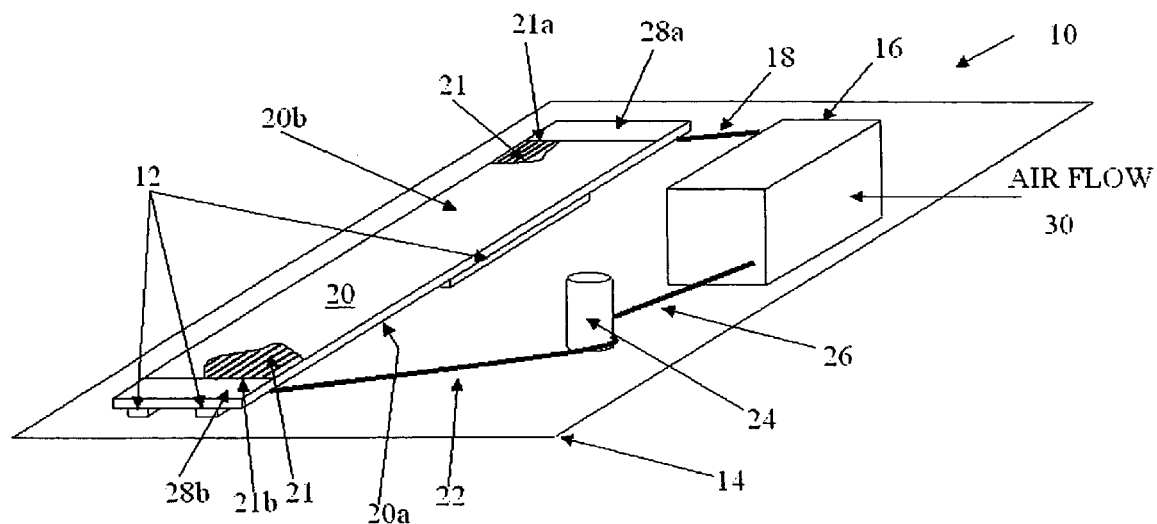
FIG. 1 is a schematic illustration of the low-profile extrusion heat exchange apparatus described in the above-referenced patent application Ser. No. 10/305,662, which is the parent application hereof and referred to in FIGS. 2-14 below.

Referring now to FIG. 1, there is shown a schematic illustration of a cooling apparatus 10 used for removing heat from certain heat generating components 12 mounted on a printed circuit board 14. The printed circuit board 14 may be housed in a host electronic device (not shown) such as computer, a laptop or notebook computer, or other electronic equipment. Due to the ongoing miniaturization of such host electronic devices, the heat generating components 12 are often located in an area of the printed circuit board 14 and of the host electronic device where space is extremely limited, especially in the "z", or height dimension.

The cooling apparatus 10 is specifically set forth and shown in co pending U.S. application Ser. No. 9/328,183 and generally includes an air-to-air heat exchanger 16, an inlet tube 18, a low-profile extrusion 20, an outlet tube 22, a conventional pump 24, and tubing 26. The low-profile extrusion 20 has a plurality of micro-tubes 21, each micro-tube 21 having a micro-tube inlet 21a and a micro-tube outlet 21b.

Micro-tubes 21 are formed by a plurality of longitudinal members. The longitudinal members may be vertical or may be offset from vertical. A preferred offset from vertical is between about 5' and 60°. More preferably, longitudinal members are offset from vertical by 30°. Furthermore, longitudinal members may be provided with a capillary groove. The capillary groove may be positioned on an external surface or on the longitudinal members. Further, the capillary grooves may be provided in groups of one, two, three or more.

Figure 7:
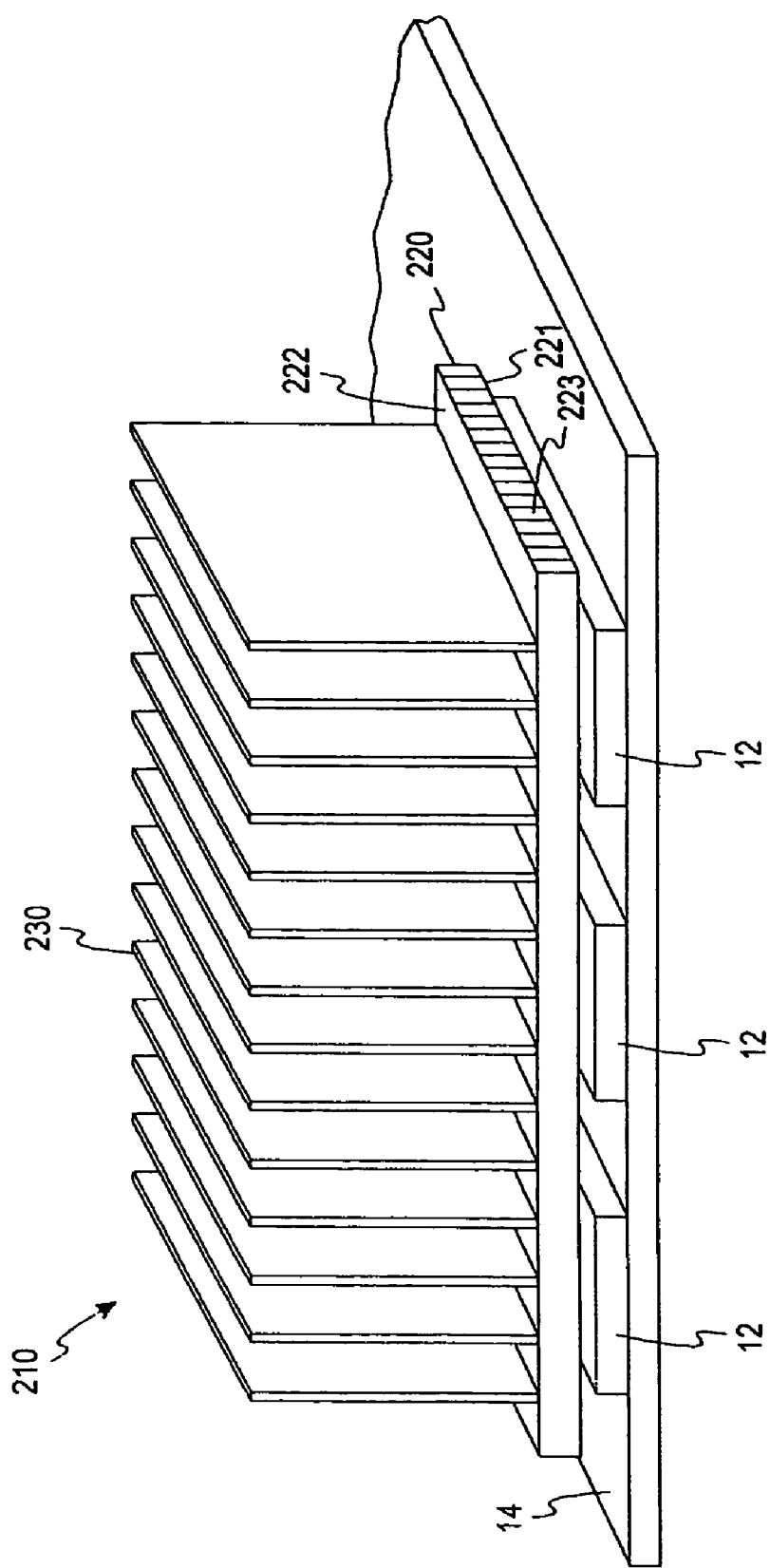
FIG. 7 is a schematic illustration of another embodiment of the above-referenced low-profile extrusion heat exchange apparatus of an unstacked variety, shown as heat pipe base/fin cooling apparatus.
Figure 8:
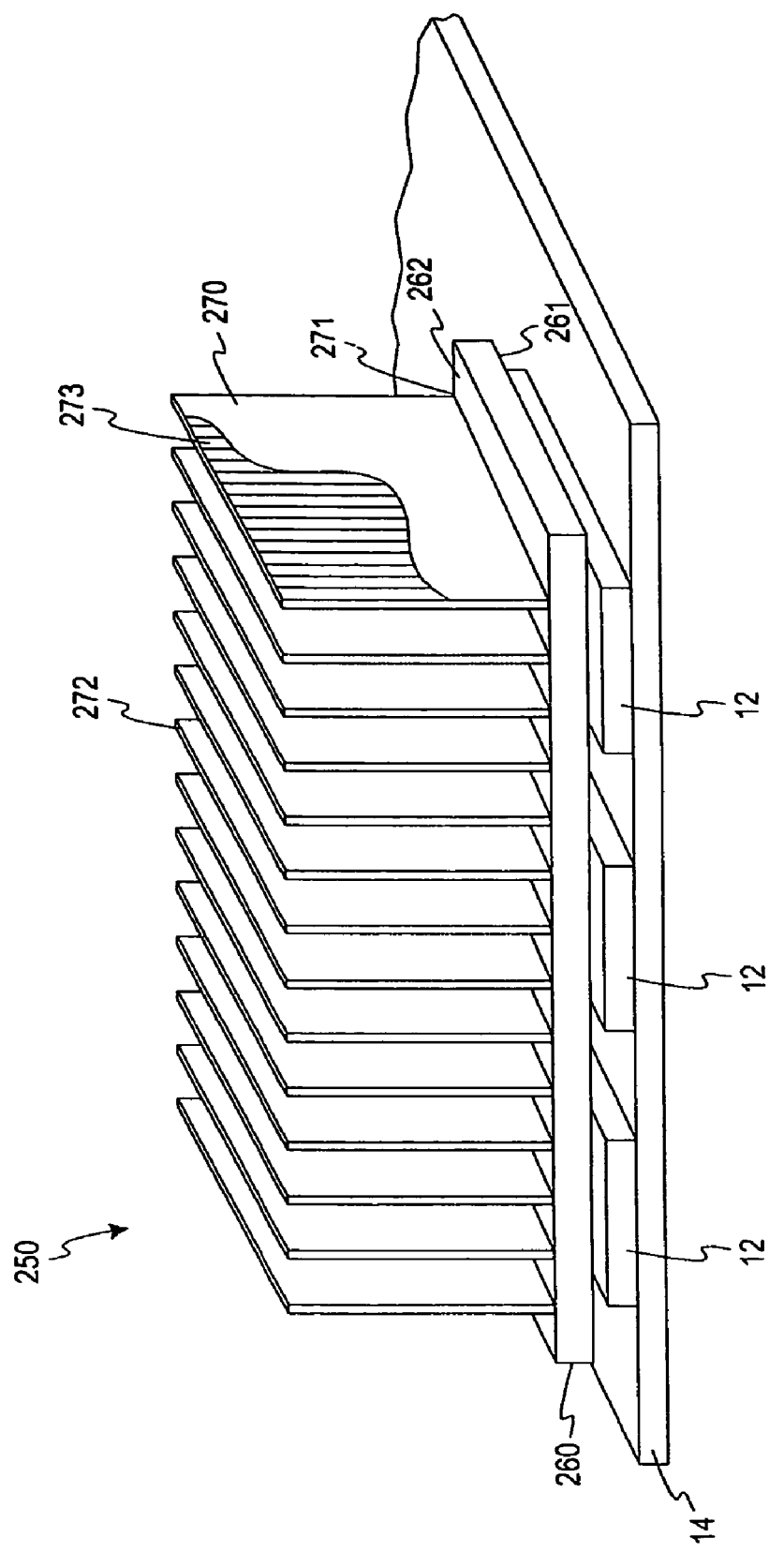
FIG. 8 is a schematic illustration of another embodiment of the above-referenced low-profile extrusion heat exchange apparatus of an unstacked variety, shown as a base/heat pipe fin cooling apparatus.

Referring still to FIG. 1, the extrusion 20 is preferably formed with a flat surface on its underside 20a for contacting heat generating components 12, and may be formed with external fins on its top side 20b to maximize heat transfer, if space allows. It is notable that the micro-tubes 21 formed in the extrusion 20 may be of nearly any geometry and that shapes with flattened heat transfer surfaces are generally preferred, but tubes of any shape could be used with varying degrees of efficiency. This is best illustrated in FIGS. 7 and 8, where flat extrusions 20 with rectangular micro-tubes 21 are shown. Extrusion 20 is also preferably formed with at least one solid channel (not shown) for mounting to printed circuit board 14. Conventional thermal interface material (not shown) is preferably provided between low-profile extrusion 20 and heat generating components 12.

The micro-tube inlets 21a of the micro-tubes 21 in the extrusion 20 are interconnected in fluid communication, and to the inlet tube 18, by an inlet endcap 28a. Similarly, the micro-tube outlets 21b of the micro-tubes 21 in the extrusion 20 are interconnected in fluid communication, and to the outlet tube 22, by an outlet endcap 28b. Alternatively, micro-tube outlets 21a and/or 21 may be sealed by crimping the low-profile member 20. Micro-tubes outlets 21a and/or 21b may be individually sealed or connected in fluid communication. The heat exchanger 16 may contain a fluid reservoir (not shown) therein for housing a fluid such as water, glycol, alcohol, or other conventional refrigerants. In addition, a wick, such as screen may be provided within one or all of micro-tubes 21. In this case, fluid from the heat exchanger 16 is circulated through the inlet tube 18, the low-profile extrusion 20, the outlet tube 22, and the tubing 26 via the pump 24. Alternatively, the entire cooling apparatus 10 may be evacuated and charged with fluid which is then circulated via the pump 24.

During operation of the host electronic device, heat generated by heat generating components 12 is transferred from heat generating components 12 to an evaporator section of low-profile extrusion 20, to the fluid circulating within low-profile extrusion 20, and then to heat exchanger 16 from a condenser section of low-profile extrusion 20. Heat exchanger 16 removes the heat from the fluid in a conventional manner. Preferably, an airflow 30 is passed over heat exchanger 16 to aid in such heat removal. Cooling apparatus 10 thus efficiently removes heat from a limited space, low-profile area within the host electronic device (the location of low-profile extrusion 20) to an area where it can be removed at a more convenient location and envelope (the location of heat exchanger 16). A stacked array approach is set forth and shown in co-pending U.S. patent application Ser. No. 10/998, 198 filed on Nov. 26, 2004 and incorporated herein by reference.

Figure 2:
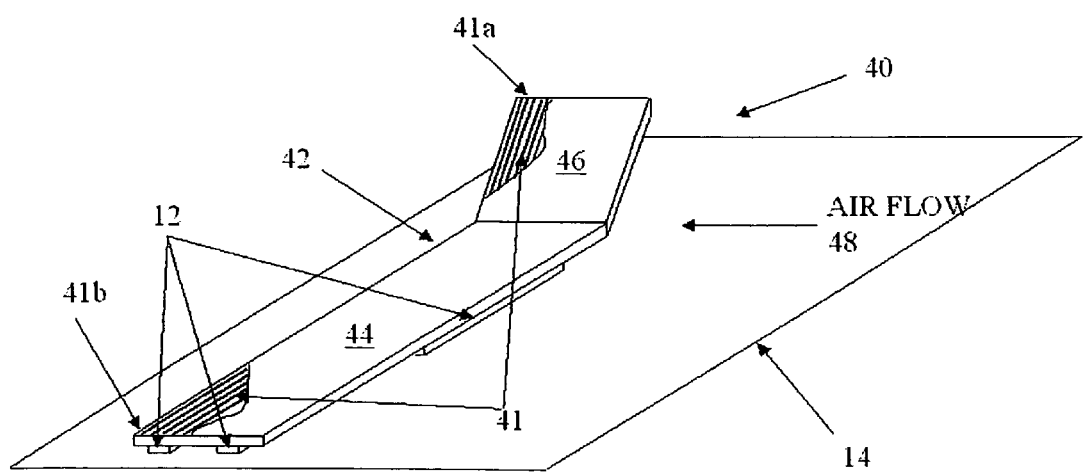
FIGS. 2 and 3 are schematic illustrations of another embodiment of the low-profile extrusion heat exchange apparatus immediately above-referenced.
Figure 3:
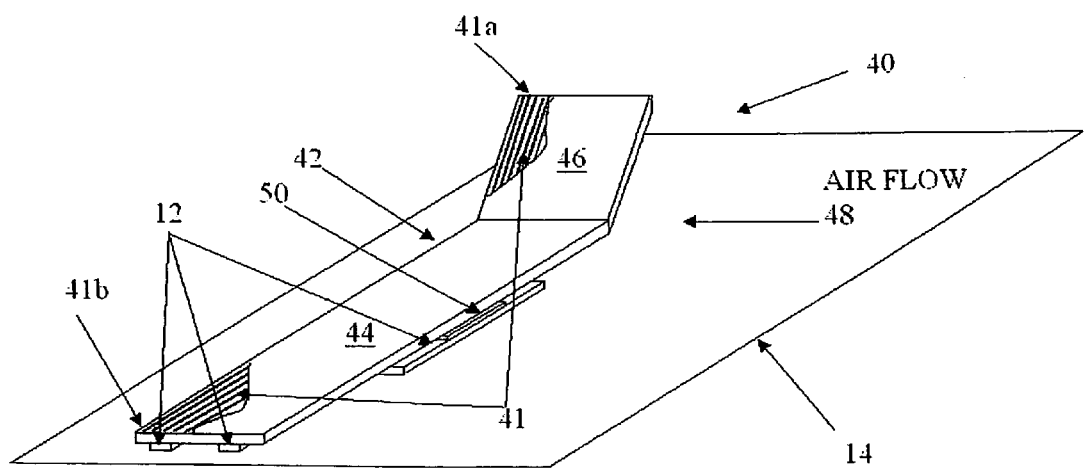

FIGS. 2 and 3 are schematic illustrations of a cooling apparatus 40 used for removing heat from heat generating components 12 on printed circuit board 14. Referring now to FIG. 2, cooling apparatus 40 generally comprises a low-profile extrusion 42 manufactured as a heat pipe capable of phase change heat transfer. A preferred method of making a low-profile heat pipe extrusion 42 is described in greater detail hereinbelow. The low-profile heat pipe extrusion 42 is preferably formed with micro-tubes 41, each micro-tube 41 having a conventional wick structure such as internal fins, grooved inner sidewalls, or metal screens, so as to maximize their heat transfer capability via capillary action.

To form a heat pipe, the micro-tubes 41 of the low-profile heat pipe extrusion 42 are evacuated and then charged with a fluid such as water, glycol, alcohol, or other conventional refrigerants before sealing the ends 41a and 41b of the micro-tubes 41. The ends may be sealed by crimping. By providing vertically offset longitudinal members, longitudinal members tend to lay over during crimping rather than buckling. Therefore, vertically offset members may be advantageous. As is known in the art, a heat pipe generally has an effective thermal conductivity of several multiples higher than that of a solid rod. This increase in efficiency is due to the fact that the phase change heat transfer coefficients are high compared to the thermal conductivity of conventional materials.

The low-profile heat pipe extrusion 42 is preferably formed into an evaporator section or first portion 44 for contacting heat generating components 12 and a raised or condenser section second portion 46. First portion 44 and second portion 46 are preferably substantially similar in construction to low-profile extrusion 20 of FIG. 1, except endcaps 28 are not required. First portion 44 functions as the evaporator section of the heat pipe, and second portion 46 functions as the condenser section of the heat pipe.

During operation of the host electronic device, heat generated by heat generating components 12 is transferred from heat generating components 12 to first portion 44. This heat causes the liquid within the micro-tubes 41 in first portion 44 to change to vapor, consuming some of the generated heat. Because the vapor is less dense than the surrounding liquid, the vapor and associated heat rise into the micro-tubes 41 in second portion 46. Of course, heated liquid may also be transferred from first portion 44 to second portion 46 via the capillary action of the wick structures of the micro extruded tubes therein. In second portion 46, the vapor condenses into liquid onto the inner side walls of the micro extruded tubes 41. The heat generated by the condensation reaction, as well as any heat transferred via capillary action of the wick structure, is then transferred to air flow 48. Cooling apparatus 40 thus efficiently removes heat from a limited space, low-profile area within the host electronic device (the location of first portion 44) to an area where it can be removed at a more convenient location and envelope (the location of second portion 46). Of course, if low-profile heat pipe extrusion 42 is formed with internal wick structures, it is not necessary that second portion 44 be raised from, or higher than, first portion 42.

Referring now to FIG. 3, low-profile heat pipe extrusion 42 is shown in operation with a conventional thermoelectric cooler (TEC) 50 in contact with one of heat generating components 12. A preferred TEC is sold by Marlow Industries, Inc. of Dallas, Tex. TEC 50 facilitates the heat transfer between the heat generating component 12 and first portion 44 of low-profile heat pipe extrusion 42, and thus is preferred for use with heat generating components 12 that have high power densities.

Figure 4:
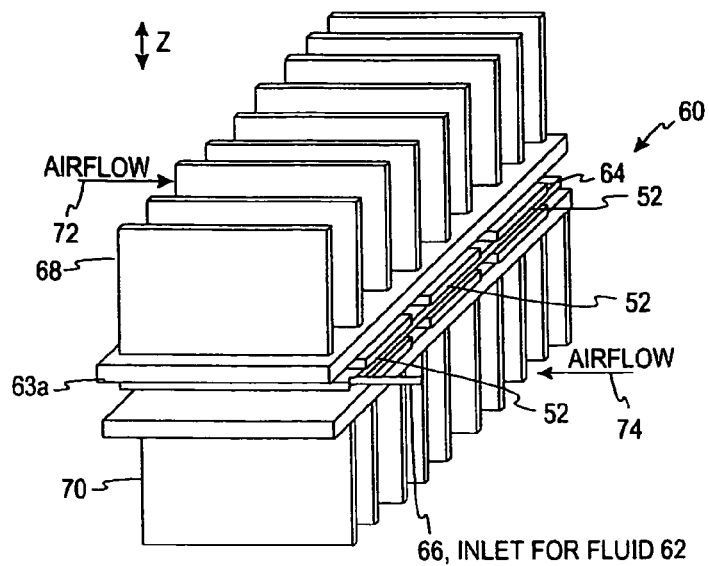
FIG. 4 is a schematic illustration of another embodiment of the above-referenced low-profile extrusion heat exchange apparatus of an unstacked variety, shown as heat transfer component of a recirculatory system.

FIG. 4 is a schematic illustration of a cooling apparatus 60 used for removing heat from a fluid 62, such as water, glycol, alcohol, or other conventional refrigerants. Fluid 62 is then used to cool conventional heat generating components, such as heat generating components 12 of printed circuit board 14. By way of example, cooling apparatus 60 may be used in place of conventional heat exchanger 16 in FIG. 1.

Cooling apparatus 60 generally comprises a low-profile extrusion 64, an inlet endcap 63a, an inlet tube 66, an outlet endcap (not shown), an outlet tube (not shown), thermoelectric coolers 52, and conventional bonded fin heat sinks 68 and 70. The low-profile extrusion 64 is preferably substantially similar in construction to low-profile extrusion 20 of FIG. 1, with a plurality of micro-tubes (not shown) having a micro-tube inlet and a micro-tube outlet (not shown). The micro-tube inlets of the micro-tubes in the extrusion 64 are interconnected in fluid communication, and to the inlet tube 66, by the inlet endcap 63a. Similarly, the micro-tube outlets of the micro-tubes in the extrusion 64 are interconnected in fluid communication, and to the outlet tube, by an outlet endcap.

The low-profile extrusion 64 preferably has generally flat bottom and top surfaces for contact with thermoelectric coolers (TEC) 52. The conventional bonded fin heat sink 68 is coupled to TECs 52 on the top surface of low-profile extrusion 64, and the conventional bonded fin heat sink 70 is coupled to TECs 52 on the bottom surface of low-profile extrusion 64.

In operation, the low-profile extrusion 64 serves as a manifold, and the TECs 52 remove heat from fluid 62 flowing through the micro-tubes of the low-profile extrusion 64. This removed heat is transferred from TECs 52 to bonded fin heat sinks 68 and 70, which dissipate the heat to atmosphere in a conventional manner. Preferably, airflows 72 and 74 pass over and through heat sinks 68 and 70 to facilitate such heat dissipation.

Low-profile extrusion 64 has a smaller size and mass than conventional heat exchanger manifolds. For example, a conventional manifold has a minimum profile, or height, in the "z" direction of about 0.75 inches, and low-profile extrusion 64 may have a profile as low as about 0.1 inches. The reduced mass of low-profile extrusion 64 is believed to produce a cooling apparatus 60 with a near zero time constant, increasing startup performance and temperature control. Therefore, cooling apparatus 60 is especially advantageous in applications involving lasers. The wavelength of a laser beam, and thus beam properties, is strongly influenced by temperature, and the tighter temperature control believed to be provided by cooling apparatus 60 is extremely beneficial.

Figures 5A, 5B:
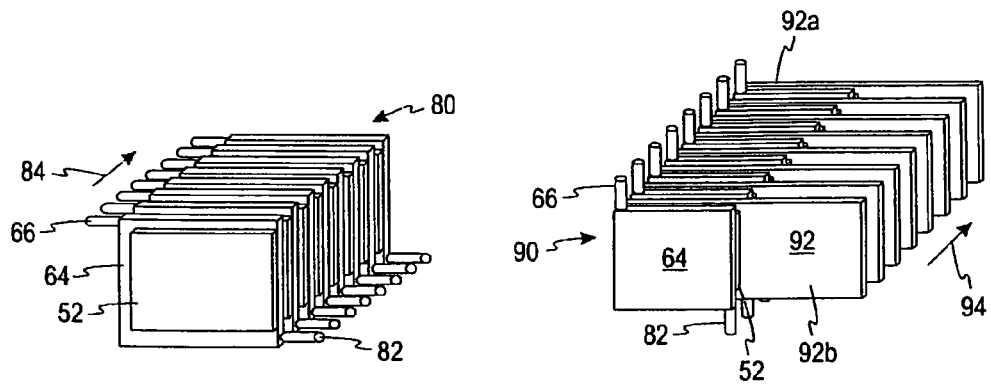
FIG. 5A is a schematic illustration of another embodiment of the above-referenced low-profile extrusion heat exchange apparatus of an unstacked variety, shown as a liquid to liquid manifold cooling apparatus.
FIG. 5B is a schematic illustration of another embodiment of the above-referenced low-profile extrusion heat exchange apparatus of an unstacked variety, shown as a liquid to air manifold cooling apparatus.
Figure 5C:
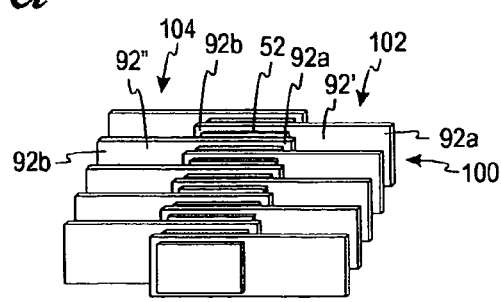
FIG. 5C is a schematic illustration of another embodiment of the above-referenced low-profile extrusion heat exchange apparatus of an unstacked variety, shown as an air to air manifold cooling apparatus.

FIGS. 5A, 5B, and 5C are schematic illustrations of the cooling apparatus' referenced in FIGS. 2-4 incorporating a stacked heat pipe/TEC configuration. FIG. 5A shows a cooling apparatus 80 having a plurality of LPE's 64 and TECs 52 arranged in a serial fashion. A TEC 52 is disposed between, and is in contact with, each of the extrusions 64. Only one low-profile extrusion 64 and one TEC 52 is numbered in FIG. 5A for clarity of illustration. Fluid 62 enters each extrusion 64 via inlet 66 and exits each extrusion 64 via an outlet 82. In operation, TECs 52 remove heat from fluid 62 flowing through LPE's 64. This removed heat is transferred to airflow 84 passing over cooling apparatus 80.

FIG. 5B shows a cooling apparatus 90 having a plurality of LPE's 64, TECs 52, and low-profile heat pipe extrusions 92 arranged in a serial fashion. More specifically, a TEC 52 is disposed between, and is in contact with, each low-profile extrusion 64 and low-profile heat pipe extrusion 92. Only one low-profile extrusion 64, one TEC 52, and one low-profile heat pipe extrusion 92 are numbered in FIG. 5B for clarity of illustration. Each low-profile heat pipe extrusion 92 is preferably substantially similar in construction to low-profile heat pipe extrusion 42 of FIG. 1, excluding raised portion 46. Fluid 62 enters each extrusion 64 via inlet 66 and exits each extrusion 64 via outlet 82. In operation, each TEC 52 removes heat from fluid 62 flowing through an adjacent low-profile extrusion 64. This removed heat is transferred to the evaporator portion 92a of the adjacent low-profile heat pipe extrusion 92. The heat is then transferred to the condenser portion 92b of the low-profile heat pipe extrusion 92, as is explained hereinabove in connection with low-profile heat pipe extrusion 42 of FIGS. 2 and 3. An airflow 84 passing over cooling apparatus 90 dissipates heat from each condenser portion 92b of each low-profile heat pipe extrusion 92.

FIG. 5C shows a cooling apparatus 100 having a plurality of TECs 52 and low-profile heat pipe extrusions 92 arranged in a serial fashion. More specifically, a TEC 52 is disposed between, and is in contact with, each low-profile heat pipe extrusion 92, and the "free end" of adjacent low-profile heat pipe extrusions 92 extend in opposite directions. Only one TEC 52 and two low-profile heat pipe extrusions, 92' and 92" are numbered in FIG. 5C for clarity of illustration. In operation, a hot airflow 102 flows over each evaporator portion 92a of low-profile heat pipe extrusions 92'. This heat is transferred from evaporator portion 92a to condenser portion 92b of extrusion 92', as is explained hereinabove in connection with low-profile heat pipe extrusion 42 of FIGS. 2 and 3. Condenser portion 92b of extrusion 92" is in contact with TEC 52. The TEC 52 removes heat from condenser portion 92b of extrusion 92" and transfers it to evaporator portion 92a of low-profile heat pipe extrusion 92". This heat is then transferred from evaporator portion 92a to condenser portion 92b of extrusion 92". Cold airflow 104 passing over condenser portions 92b of each extrusion 92" dissipates heat from cooling apparatus 100.

Cooling apparatus 80, 90, and 100 have the same applications and advantages of cooling apparatus 60 described hereinabove. As will be appreciated by one skilled in the art, cooling apparatus 60, 80, and 90 may also be operated as heating apparatus by using thermoelectric coolers (TECs) 52 to heat, rather than to cool, a fluid.

Figure 6:
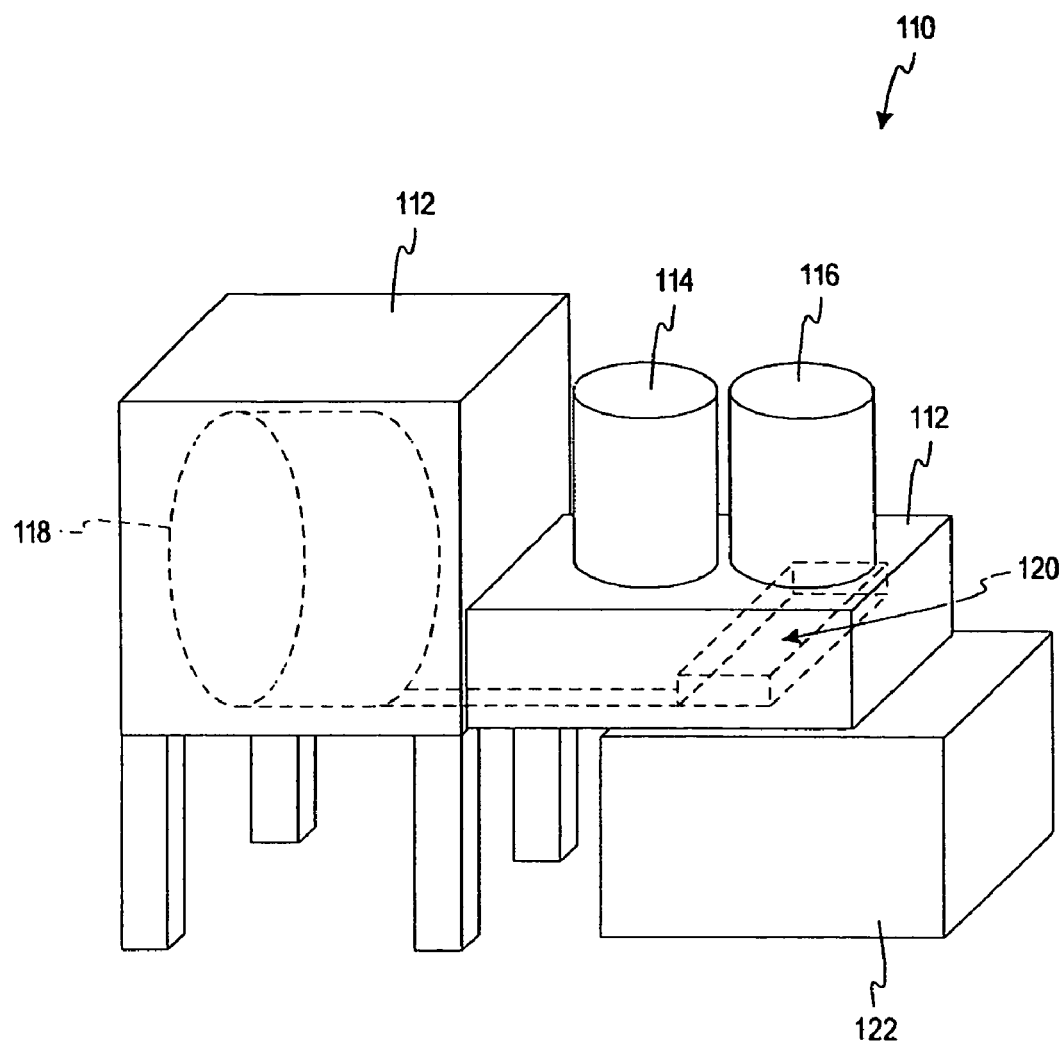
FIG. 6 is a is a schematic illustration of a method and apparatus for manufacturing heat pipes according to an embodiment of the above-referenced heat exchange apparatus of an unstacked variety.

FIG. 6 is a schematic illustration of a method and apparatus for manufacturing LPE's or heat pipes. As noted hereinabove, the preferred apparatus and method may be utilized to make LPE's of FIGS. 1, 2, 3, 4, 5A, 5B, and 5C as well as the extrusions of FIGS. 7-16. However, the preferred apparatus and method may also be utilized to make extruded hollow tubes for other heat exchangers and heat pipes.

Apparatus 110 generally includes an oven 112 having an insulated housing. A vacuum station 114 and a fluid charging station 116 are in fluid communication with oven 112. Alternatively, stations 114 and 116 may be separate from oven 112. A coil 118 is disposed within a portion of oven 112 on a conventional automatic feed system. Coil 118 may be a coil of hollow tubing, a coil of low-profile extrusion, or a coil of other conventional extrusion having a series of extruded hollow tubes therein. Furthermore, coil 118 includes any material that can be formed and welded with any fluid fill. The material may be, but is not limited to aluminum, stainless steel, carbon steel, copper, and titanium alloys. An ultrasonic welder/sealer is also provided. One model of ultrasonic welder/sealer is the Ultraseal7 series sold by American Technology, Inc. of Shelton, Conn. A brochure entitled "Ultraseal7-20 20 kHz Portable Ultrasonic Metal Tube Sealer" (hereinafter the "Amtech Brochure") provides additional information regarding the Ultraseal7 series of ultrasonic welder/sealers and is incorporated herein by reference. A preferred ultrasonic welder/sealer is the Stapla Ultrasonic gantry style seam welder.

In a conventional process, the first step is actually forming and cutting the heat exchanger, heat pipe, or extruded tubes into the desired configuration. Next, this preformed system is evacuated and charged with a fluid such as water, glycol, alcohol, or other conventional refrigerants. The system is then sealed, completing the process. Conventional processes are expensive because they are labor intensive and require long setup times for different configurations of heat exchangers, heat pipes, or extruded tubes.

However, apparatus 110 may be used to efficiently and economically produce heat exchangers, heat pipes, and extruded tubes, including LPE's, according to the following preferred process. First, coil 118 is placed within a heat producing device such as oven 112 on the automatic feed system.

Second, coil 118 is evacuated using vacuum station 114. Preferably, coil 118 is pulled down to a vacuum of about $10^{-7}$ torr for a period lasting approximately twenty four hours to many weeks depending on performance requirements.

Third, coil 118 is charged with a known amount of fluid, such as water, glycol, alcohol, acetone or other conventional refrigerants, using charging station 116. Acetone is the preferred fluid. Alternatively, coil 118 may be evacuated and charged outside oven 112.

Fourth, oven 112 heats coil 118 until at least some of the fluid is in the vapor phase, and the vapor fills the interior of coil 118 evenly.

Fifth, using the automatic feed system, the heated and charged coil 118 is reeled out. Preferably the fluid exits the oven 112 at approximately 40° C. to 60° C. allowing enough thermal inertia to draw vapor into the extrusion external to the oven. A temperature sender container may be provided to ensure that the fluid exit temperature is maintained at a desired level.

The coil is then processed by crimping, sealing, and cutting the coil 118 into desired lengths. The temperature difference between the oven 118 and the ambient air (or air-conditioned air) temperature condenses the charging fluid in each pipe before it is crimped. These temperatures and flows are used to control the individual heat pipe fills via a weight analysis. A computer and scale monitor the weight of each part and adjust the oven temperatures accordingly.

Subsequent steps comprise crimping, sealing and cutting the coil 118. A hydraulic press, pneumatic or mechanical means may be used for crimping. An ultrasonic welder/sealer, or another standard welding method such as laser electron beam, resistive, TIG, or MIG welding may be used during the sealing stage. Ultrasonic welding is the preferred process. A plasma cutter, or other standard welding method mentioned herein may be used in the cutting stage. However, the plasma cutter is the preferred method. Finished product is collected within container 122. In this manner, heat exchangers, heat pipes, and extruded tubes, including LPE's, are formed while charged with fluid, significantly reducing the setup time and vacuum expense over conventional processes.

In addition, by separating the coil side of the process from the crimping, sealing and welding process steps, the temperatures for the process steps can be adjusted so as to be in the fluid range for the working fluid. Thus, if a cryogenic heat pipe (charging fluid is typically a gas at normal room temperature) is to be manufactured, the temperature of the process steps would be adjusted such that the charging fluid is a liquid. In a similar manner, high temperature heat pipes, where the charging fluid is typically a solid at room temperatures, can be manufactured.

Referring now to FIG. 7, there is shown an illustration of another embodiment of a low-profile cooling system of an unstacked variety. A cooling apparatus 210 is used for removing heat from heat generating components 12 on a printed circuit board 14. The cooling apparatus 210 comprises a low-profile extrusion 220 manufactured as a heat pipe capable of phase change heat transfer. The low-profile heat pipe extrusion 220 is formed having a plurality of micro-tubes 223, preferably having therein a conventional wick structure such as internal fins, grooved inner side walls, or metal screens, so as to maximize the heat transfer capability via capillary action. The micro-tubes 223 of the low-profile heat pipe extrusion 220 are evacuated and then charged with a fluid such as water, glycol, alcohol, or other conventional refrigerants, before the ends of the micro-tubes are sealed.

Referring still to FIG. 7, the low-profile heat pipe extrusion 220 has a first surface 221 for engaging the heat generating components 12 and receiving heat therefrom. On a second surface 222 of the low-profile extrusion 220, a conventional bonded fin heat sink 230 or a plurality of cooling fins are mounted to the low-profile extrusion 220. Preferably, the micro-tubes 223 are disposed in a direction perpendicular to the fins 230 for transferring heat between each of the individual fins 230. The heat transfer between the individual fins 230 promotes an even distribution of heat across each of the fins 230. However, the micro-tubes 223 can be oriented for the transfer of heat along the length of the fins 230. Additionally, in one embodiment, the micro-tubes 223 of the low-profile extrusion 220 are oriented for disbursing heat from the heat generating components 12 to areas of the low-profile extrusion 220 which are not in contact with the heat generating components 12.

Still referring to FIG. 7, the use of the low-profile extrusion 220 for transferring heat in the cooling apparatus 210 increases the effective surface area that is transferring heat from the heat generating components to the cooling fins 230. The resulting cooling apparatus is therefore smaller in size and lighter in weight for the same effective cooling attributes. In some embodiments, the low-profile cooling system of an unstacked variety can decrease the weight of an apparatus for cooling a heat generating component by as much as 50% over traditional fins mounted via a metal plate.

Referring now to FIG. 8, there is shown an illustration of another embodiment of a low-profile cooling system of an unstacked variety, showing a cooling apparatus 250 used for removing heat from heat generating components 12 on printed circuit board 14. The cooling apparatus generally comprises a base 260 and a plurality of low-profile extrusion fins 270. The base 260 has a first side 261 for transferring heat between the cooling apparatus 250 and heat generating components 12. The base 260 also has a second surface 262 for mounting the low-profile extrusion fins 270.

Referring still to FIG. 8, the low-profile extrusion fins 270 are LPE's manufactured as a heat pipe capable of phase change heat transfer. The low-profile extrusion fins 270 are preferably formed with a plurality of micro-tubes 273, each internally having a conventional wick structure such as fins, grooved side walls, or metal screens, so as to maximize the heat transfer capability via capillary action. The micro-tubes 273 of the low-profile extrusion heat piping 270 are evacuated and then charged with a fluid such as water, glycol, alcohol, or other conventional refrigerants, before the micro-tubes 273 are sealed.

Still referring to FIG. 8, a first end 271 of the low-profile extrusion fins 270 is mounted to the second surface 262 of the base 260 with a second end 272 extending outwardly therefrom. The plurality of low-profile extrusion fins 270 are preferably mounted in rows for convection heat transfer to the surrounding environment. In one embodiment, the base 260 can also be formed from a low-profile extrusion similar to the low-profile extrusion 220 in FIG. 7.

Referring still to FIG. 8, the use of the heat pipe type low-profile extrusion fins 270 in the cooling apparatus 250 increases the effective surface area in which heat is transferred from the heat generating components to the surrounding environment via the base 260. The resulting cooling apparatus is therefore smaller in size and lighter in weight for the same effective cooling attributes.

Figure 9:
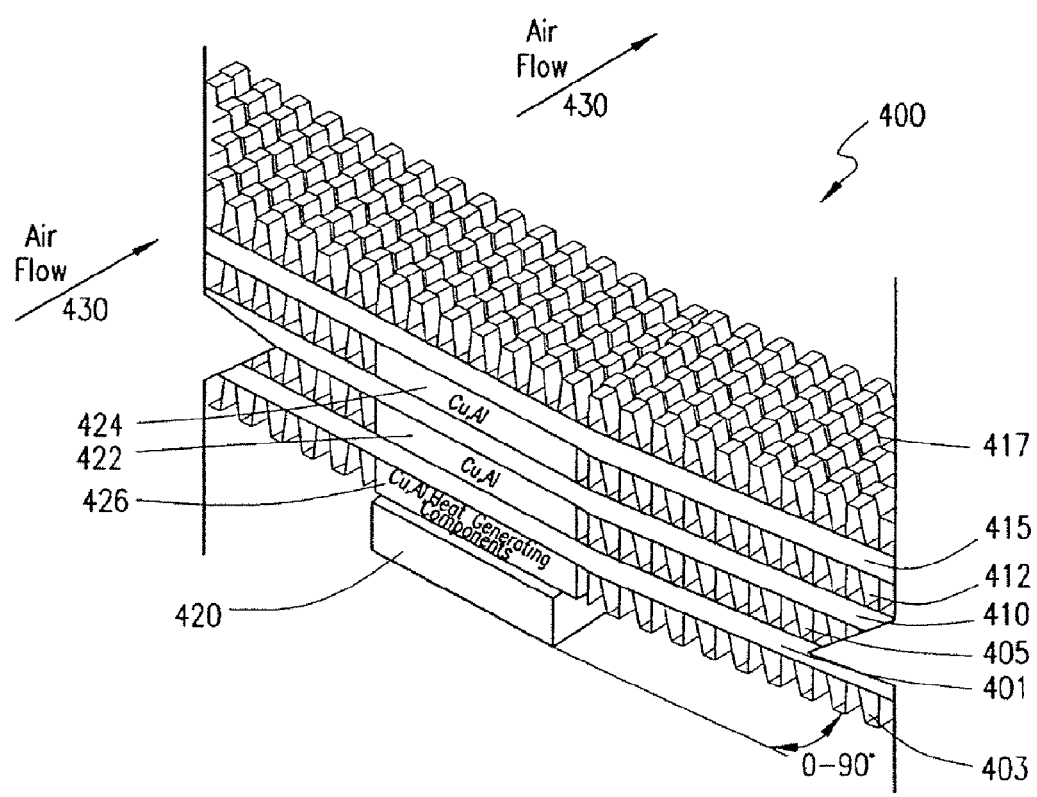
FIG. 9 is an illustration of one aspect of a stacked array of the above-referenced phase plane heat pipes.

Referring now to FIG. 9, there is shown an illustration of a stacked, low-profile cooling system 400 with an array of cooling fins secured to an assembly of the low-profile extrusion heat pipes described above. More specifically, the stacked, low-profile cooling system 400 includes a first phase plane heat pipe 401 with fins 403 secured to an undersurface thereof, and fins 405 secured to a top surface thereof. Stacked on top of the phase plane heat pipe 401 is a second phase plane heat pipe 410, also in thermal contact with the cooling fins 405 disposed on the underside thereof, and further having a set of cooling fins 412 disposed on a top surface thereof. A first thermally conductive spacer block 422 is disposed between the first phase plane heat pipe 401 and the second phase plane heat pipe 410. A third phase plane heat pipe 415 is stacked on top of the first and second phase plane heat pipes 401 and 410 also in thermal contact with the cooling fins 412 and further being assembled with cooling fins 417 stacked on a top surface thereof. Similarly, a second thermally conductive spacer block 424 is disposed between the second phase plane heat pipe 410 and the third phase plane heat pipe 415. It may be seen that the cooling fins 403, 405, 412, and 417 include elongated arrays in thermal contact with said phase plane heat pipes. As shown herein, an angle between 0 and 90 degrees is suggested relative to the angulated portion of the phase plane heat pipe extending laterally outwardly from element 426, which may be a heat source or a third thermally conductive spacer block disposed beneath the first phase plane heat pipe 401 with a heat generating component 420 disposed therebeneath (as shown in FIG. 9). The heat source 420 may be any of a plurality of heat generating components, such as computer chips and/or elements within an electrical circuit. As also referenced in FIG. 9, the type of material, either copper or aluminum, has been specified on the thermally conductive spacer blocks 422, 424, and 426. The thermally conductive spacer blocks 422, 424, and 426 provide a conduit for heat transfer from the heat generating component 420 up to and through the stacked, low-profile cooling system.

Figure 10:
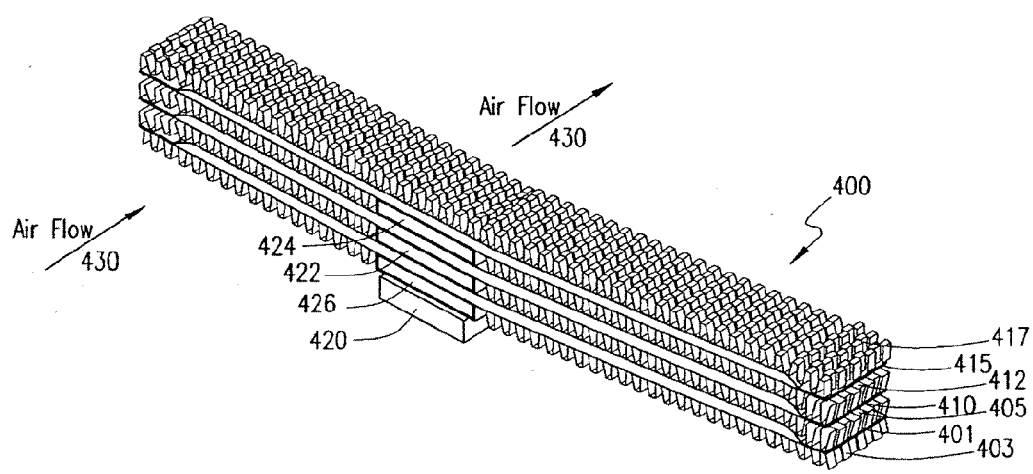
FIG. 10 is a perspective view of an embodiment of a stacked array of phase plane heat pipes.

Referring now to FIG. 10, there is shown a perspective view of the stacked, low-profile cooling system 400 of FIG. 9. In this particular embodiment, air flow is in the direction of arrow 430. Air is permitted to flow around and through the fins 417, 412, 405, and 403 to provide the cooling of the surfaces of the phase plane heat pipes 401, 410, and 415. In this way the stacked, low-profile cooling system 400 provides improved operational efficiencies.

Figure 11:
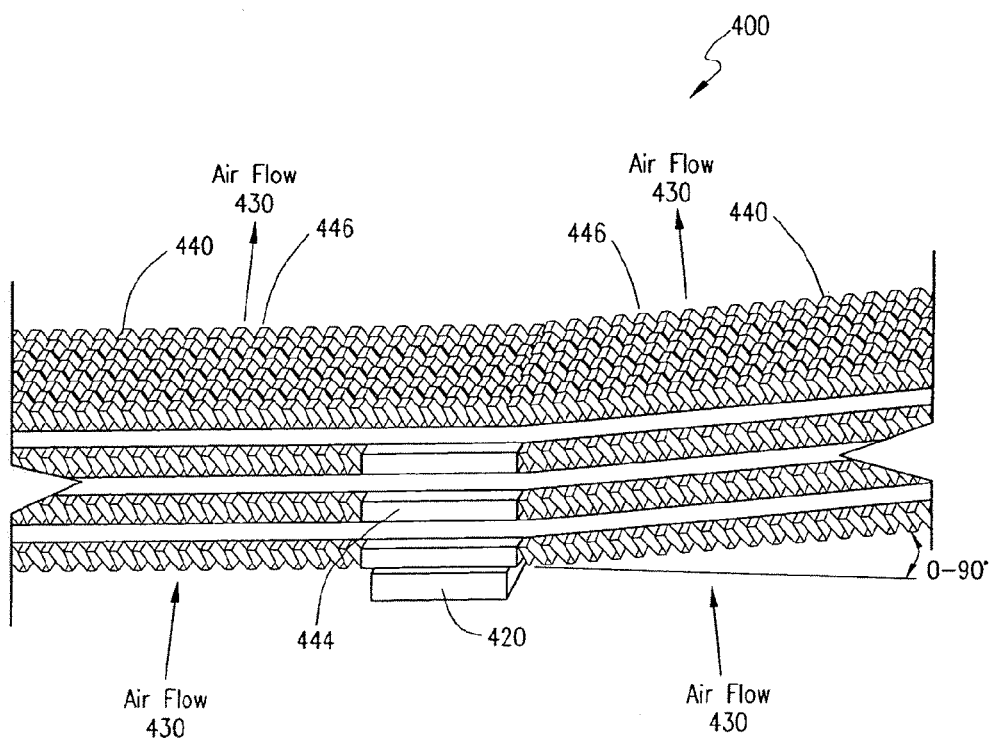
FIG. 11 is a side view of an embodiment of a stacked array of the above-referenced phase plane heat pipes.

Referring now to FIG. 11, there is shown a side view of the stacked, low-profile cooling system 400 of FIGS. 9-10. The stacked, low-profile cooling system 400, as described above, includes a condenser section 440 where condensing occurs. Likewise, an evaporator section 444 is illustrated in a generally centrally disposed area of the stacked, low-profile cooling system 400 wherein heat is absorbed from the heat source 420. The absorption of the heat by the stacked, low-profile cooling system 400 causes evaporation and the movement of the fluid within the phase plane heat pipes 401, 410, and 415 through adiabatic sections 446 wherein the fluid is allowed to expand without either loss or gain of heat, as is the technical definition of adiabatic. The angle of 0 to 90 degrees as shown herein further facilitates the movement of the evaporated fluid into the extremities of the heat pipes for the condensation thereof in the condenser sections 440, and the flow of fluid back through the adiabatic sections 446 and into the evaporator section 444 where additional heat may be absorbed.

Referring now to FIGS. 9, 10, and 11, the stacked, low-profile cooling system 400 illustrates phase plane heat pipes in an innovative manner providing a low-profile and lightweight cooling alternative to conventional heat sinks. The low-profile and flat phase plane heat pipes provide an ideal surface to attach to a heat generating component and fins to cool the component. Through the stacking of phase planes, heat removal rates of over 100 watts can be achieved for a standard 31×31 mm microprocessor, or keep lower wattage microprocessors at a lower operating temperature.

Referring still to FIGS. 9, 10 and 11 in combination, there is shown the stacks of the phase plane heat pipes 401, 410, and 415 that provide a low-profile, high watt density heat removal design. The materials of construction preferably include copper, aluminum, or other thermally conductive substances.

This is particularly true of the thermally conductive spacer blocks 422, 424, and 426 above described and secured to the heat generating component 420 (as shown in FIG. 9). The attachment process can be done through mechanically compressing the heat generating device to the heat sink with a thermal pad or thermal grease therebetween. The specific mounting mechanism is not shown herein and can include a variety of methods currently used in the heat sink market place. The base stack that is in contact with the heat generating component may also be the phase plane heat pipe as well. The fins 403, 405, 412, and 417 can be attached on both sides of the phase plane heat pipes 401, 410, and 415 providing surface area for the air/heat exchange to reduce the temperature of the cooling system 400 of FIGS. 9-11, and thus the heat generating component 420. Air is ducted across the cooling fins 403, 405, 412, and 417 and the heat pipes 401, 410, and 415 in the manner shown in FIGS. 9-11.

Again referring to the operation of the stacked, low-profile cooling system 400, the evaporator section 444 comprise that region of the phase plane heat pipes where the heat generating component 420 is positioned, as best illustrated in FIG. 11. The condenser sections 440 of the phase plane heat pipes located toward the ends thereof provide for the recirculation of the fluid therein and through the adiabatic sections 446. Significant increases in performance are provided when gravity aids the operation of the individual phase plane heat pipes. The design can have an angular range from 0 degrees (horizontal) to 90 degrees (vertical), depending on the design parameters required for a particular device. Through the stacking approach and increased effective fin-surface area, the stacked, low-profile cooling system will provide superior performance in a low-profile package. As described below, the present invention addresses not only the above-referenced angular range but also other "shapes" of heat pipes. These angular ranges and shapes will be referred to as "geometrically reoriented" as described below.

Figure 12:
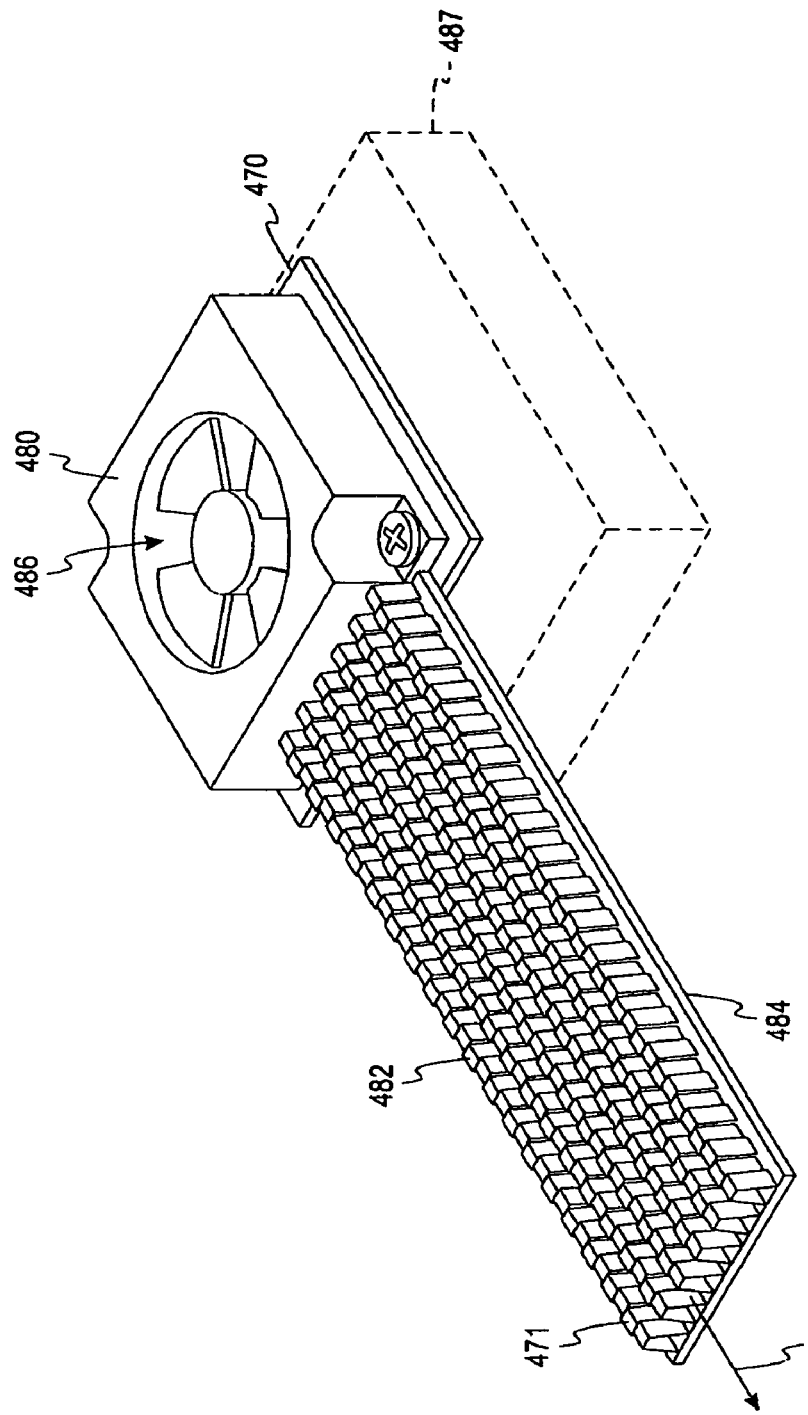
FIG. 12 is an embodiment of the above-referenced phase plane heat pipe incorporating fins and a fan.

Referring now to FIG. 12, there is shown an alternative embodiment of the stacked, low-profile cooling system incorporating a possible design for a laptop computer. A heat generating component 487 is shown in phantom and may comprise a printed circuit board disposed in a laptop computer. In this particular embodiment, air is sucked into a fan 480 as shown by arrow 486. As shown by arrow 485, air is blown out the sides through fin stock 482 mounted upon at least one phase plane heat pipe 484 of the type set forth and described in FIGS. 9-11. The evaporator section 470 of the phase plane heat pipe 484 is thermally and mechanically affixed to the heat generating component 487. The fins 482 are placed on the condenser section 471 to aid in the cooling thereof. A 0 degrees to 90 degrees orientation may be placed on the phase plane 484 between the evaporator section 470 and the condenser section 471. In another embodiment, a stacked array of heat pipes may be utilized in accordance with the stacked, low-profile cooling system, as well as the utilization of a phase plane heat pipe on both sides of the fan 480.

Figure 13:
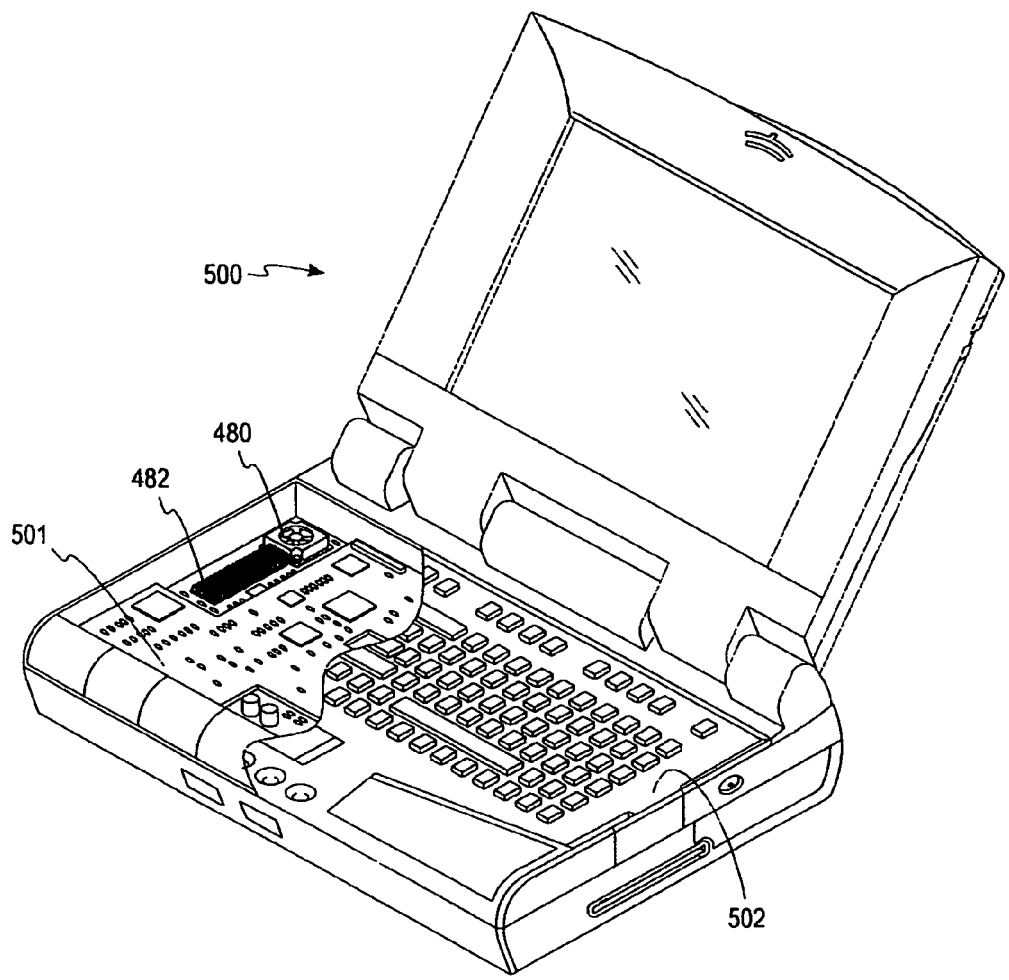
FIG. 13 is an illustration of a laptop computer including above-referenced phase plane heat pipe incorporating fins and a fan.

Referring now to FIG. 13, a laptop computer 500 including an embodiment of the stacked, low-profile cooling system of FIG. 12 is described. The fan 480 is disposed in a corner beneath a keyboard 502 and above a heat source 501 such as a circuit board. Air is drawn in to the fan 480 and dispersed outward through the fin stock 482. Although the fin stock 482 is illustrated as being positioned vertically in the laptop, the fin stock 482 may also be positioned in other orientations, such as horizontally.

Figure 14:
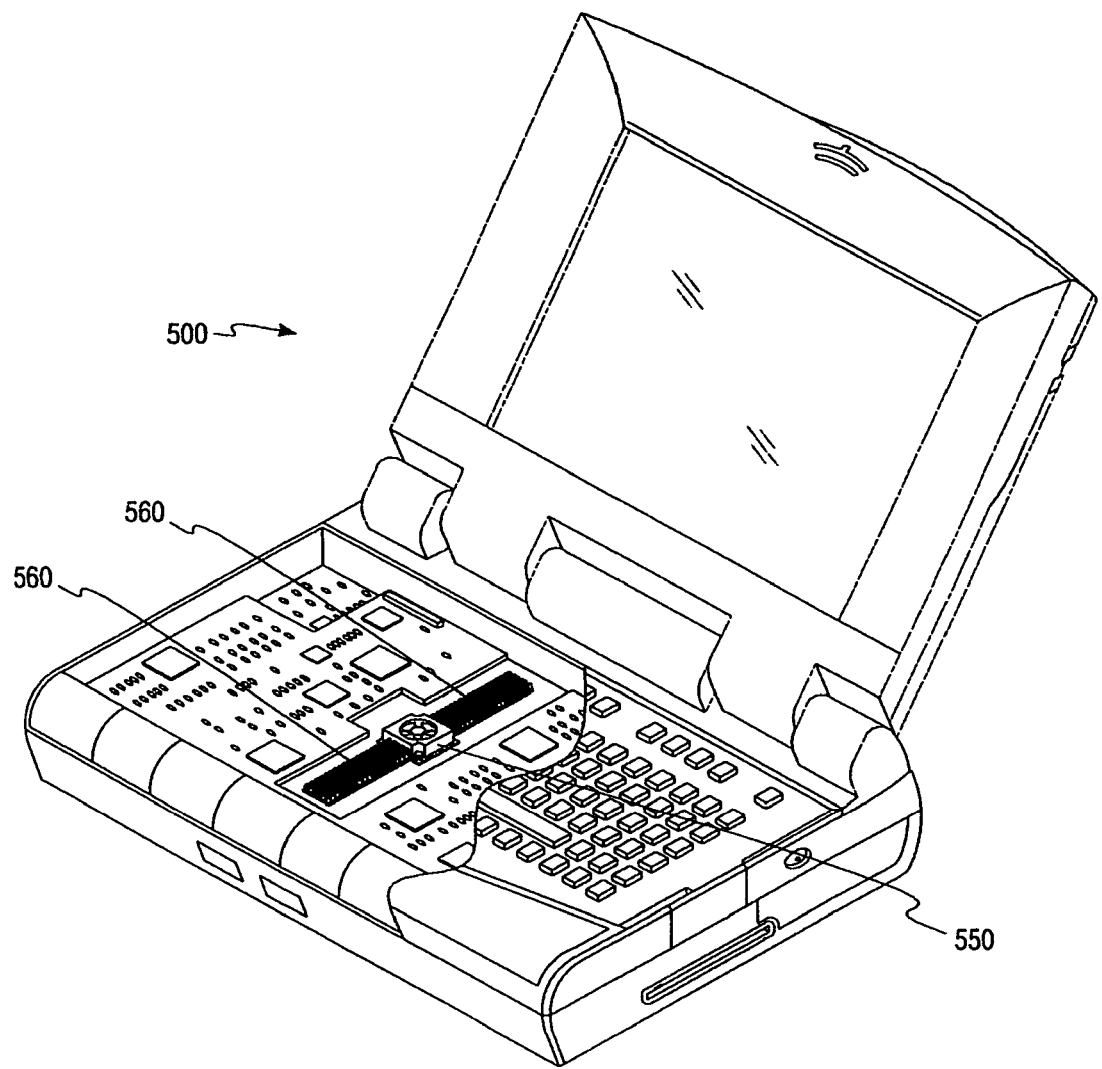
FIG. 14 is an illustration of a laptop computer including an another embodiment of the above-referenced phase plane heat pipe incorporating fins and a fan of FIG. 13.

Referring now to FIG. 14, there is shown another embodiment of the stacked, low-profile cooling system of FIG. 12 disposed in a laptop computer 500. In this embodiment, a fan 550 is connected with two fin stocks 560 for dispersing heat. The fan 550 may be located anywhere within the laptop 500 and have one or more fin stocks 560 associated with the fan 550. The fin stocks 560 may be located at opposite sides of the fan 550, or form an L-shape. The fan 550 may also have more than two fin stocks 560 associated therewith.

Figure 15:
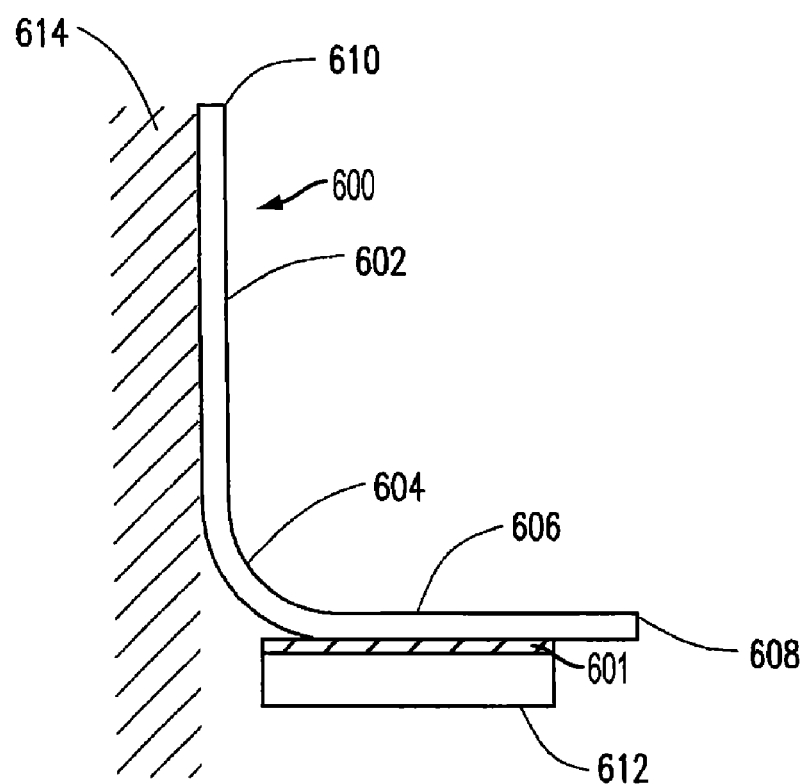
FIG. 15 is an illustration of an embodiment of a geometrically reoriented, or bent heat pipe according to the principles of the present invention.

Referring now to FIG. 15, there is illustrated one embodiment of a geometrically reoriented, or bent, heat pipe according to the principles of the present invention. In this embodiment, heat pipe 600 includes an evaporator region 606, an adiabatic region 604 and an condenser region 602. Condenser region 602 may be advantageously placed near the external surface 614 of an enclosure for removal of heat to an external environment, while the evaporator region 606 is placed in thermal contact with a heat generating component 612. As mentioned above in relation to FIG. 6., ends 610 and 608 are crimped so as to contain a heat transfer fluid within the internal micro-tubes (not shown) of heat pipe 600. A conductive spacer block 601 may also be disposed between the heat pipe 600 and the heat generating component 612, in certain embodiments.

Still referring to FIG. 15, this particular embodiment of a geometrically reoriented heat pipe 600 may be seen to provide specific advantages in a "space or shape challenged" environment. The term "space or shape challenged" refers to an environment where the means for transferring thermal energy into or out of a particular area is either circuitous, encumbered and/or otherwise restricted due to the placement of the heat generating component and/or components or articles therearound. More specifically, reference is made to the electronic components in a computer, which is referred to herein for purposes of illustration only. The need for thermal transfer in a crowded, complex component environment may also exist relative to other manufactured devices and/or assemblies. References to the cooling of a computer component is, however, specifically set forth herein as one example of the advantageous application of one embodiment of the present invention.

Referring still to FIG. 15, the geometrically reoriented heat pipe 600 provides means for the removal of thermal energy from the first area of a space or shape challenged environment to a second area where heat dissipation may occur. This particular design may, for example, be appropriate where a component generated heat is disposed beneath a second component disposed vertically thereabove blocking ease and access thereto. The geometrically reoriented heat pipe 600 thus provides an evaporator region 606 in a position geometrically reoriented from the condenser region 602 affording thermal transfer and heat dissipation through the space or shape challenged area. The geometries of space or shape challenged areas may, of course, vary from one manufactured system to another. For example, printed circuit boards may be disposed in various areas of a computer relative to other electronic components requiring a wide variation of heat pipe geometries and placements. The present invention addresses these aspects with geometrical reorientations particularly adapted for a given space or shape challenged environment.

Figure 16:
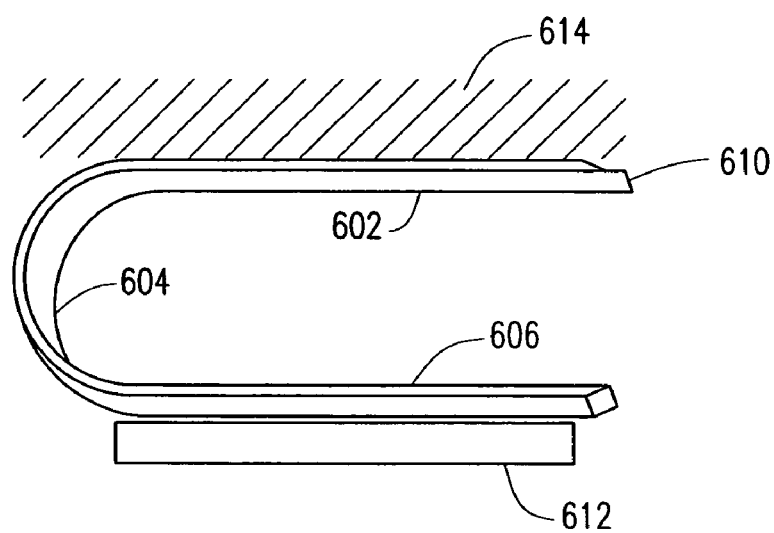
FIG. 16 is an illustration of an another embodiment of a geometrically reoriented heat pipe for the removal of heat from a restricted enclosure according to the principles of the present invention.

Referring now to FIG. 16, there is illustrated another embodiment of heat pipe 600 of FIG. 15. In FIG. 16, heat pipe 700 may be advantageous in restricted enclosures containing many heat generating components. In this manner, evaporator region 706 may be adapted to function as an evaporator and condenser region 702 may be adapted to function as an condenser. An adiabatic region 704 would also perform the same function as in FIG. 15. In this manner, heat may be removed from heat generating devices enclosed in a restricted enclosures having minimal space available for heat removal devices.

In operation, with reference to FIGS. 15-16, heat from the heat generating components 612 and 712 abutting condenser regions 606 and 706 causing the heat transfer fluid contained in the micro-tubes (not shown) of condenser regions 606 and 706 to vaporize. The vapor rises into evaporator regions 602 and 702 through adiabatic regions 604 and 704. The vaporized heat transfer fluid condenses in evaporator sections 602 and 702 which may be advantageously placed near the external side 614 and 714 of the enclosure. Space and shape challenged environments are thus seen to include those assemblies where the heat generating component is disposed near another component or a wall.

In this manner, heat generated from heat generating components 612 and 712 may be transferred to the evaporator regions 606 and 706 of heat pipes 600 and 700 through the adiabatic sections 604 and 704 and to the condenser sections 602 and 702 for disposal to the external environment such as the exterior side 614 and 714 of the enclosures. The embodiments illustrated in FIGS. 15 and 16 of heat pipes 600 and 700 are well suited for environments where cramped working conditions and cramped component spaces are likely i.e., such as notebook computers.

Figure 17:
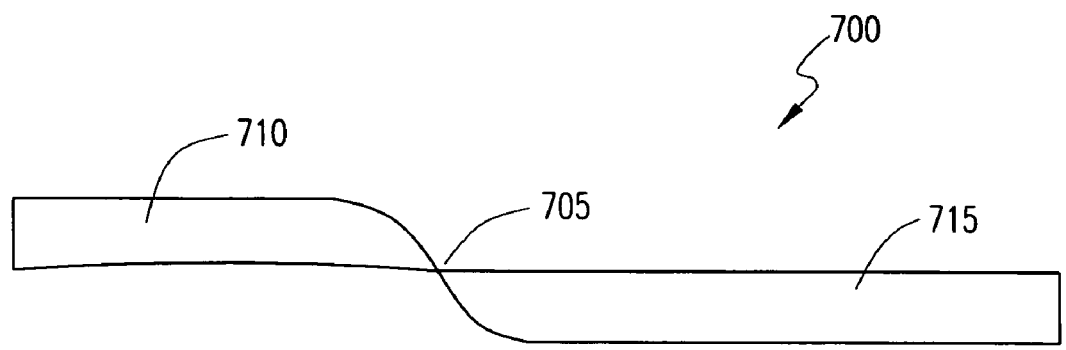
FIG. 17 is an illustration of an embodiment of a geometrically reoriented heat pipe for heat removal utilizing gravity assistance according to the principles of the present invention.

Referring now to FIG. 17, there is illustrated yet another embodiment of a heat pipe according to the principles of the present invention showing a heat pipe 800 having a twist 805 in the middle of heat pipe 800 such that a first portion 810 is generally axially aligned with, but surface-area-wise, generally orthogonal to, a second portion 815. The first portion 810 may act as an evaporator, while the second portion 815 may act as a condenser. The heat pipe 800 is filled (charged) with a heat transfer fluid as discussed above in relation to FIG. 6.

In the embodiment illustrated in FIG. 17, the first portion 710 functions as an evaporator while the second portion 715 functions as a condenser as discussed above in relation to FIGS. 3 and 4. The purpose of having a horizontal portion and vertical position is to use gravity to assist in the movement of the heat transfer fluid contained within the micro-tubes (not shown). In this way, the heat removal process is assisted not only through the internal wick structures previously discussed in relation to FIGS. 1 through 4 but is also assisted by gravity in moving the vapor and/or liquid from the evaporator and/or condenser regions of the heat pipe 800.

Figure 18:
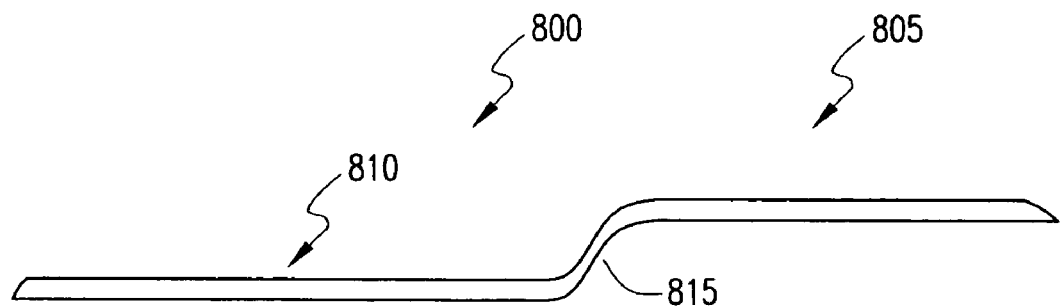
FIG. 18 illustrates an another embodiment of a the geometrically reoriented heat pipe illustrated in FIG. 17.
Figure 19A:
FIGS. 19A-19D are additional view of the various embodiments shown in FIGS. 15-18.
Figure 19B:
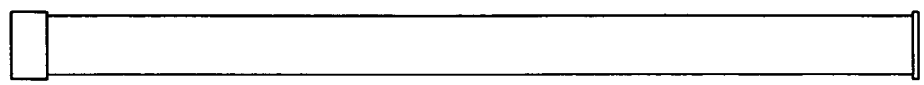
Figure 19C:
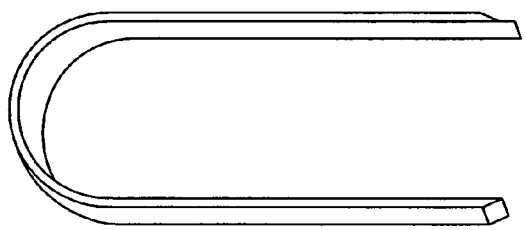
Figure 19D:
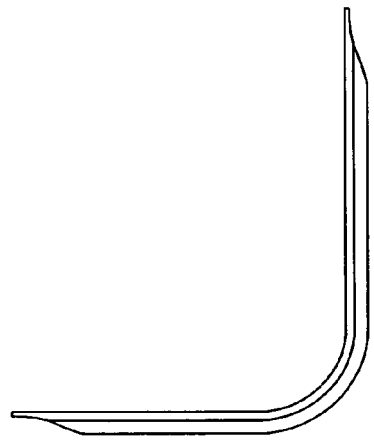

Referring now to FIG. 18, there is illustrated another embodiment of a heat pipe 800 of FIG. 17 of the present invention showing heat pipe 900 wherein an evaporator portion 905 is axially offset and elevated from an condenser portion 910. This shape allows a majority of the evaporator section 905 to be used to remove heat from a heat generating component 904. This may be an application specific design such in a motor in a car, computer component or any other such device.

Referring now in combination to FIGS. 19A, 19B, 19C and 19D, there are shown additional views of the various embodiments shown in FIGS. 15-18.

It is believed that the operation and construction of the present invention will be apparent from the foregoing description of a preferred embodiment. While the device shown is described as being preferred, it will be obvious to a person of ordinary skill in the art that various changes and modifications may be made therein without departing from the spirit and scope of the invention as defined in the following claims. Therefore, the spirit and the scope of the appended claims should not be limited to the description of the preferred embodiments contained herein.

The invention claimed is:

1. A cooling system for removing heat from at least one heat generating component, said cooling system comprising:
 a first low-profile phase plane heat pipe having a geometrically reoriented surface adapted for receiving heat from the at least one heat generating component along a first section of the geometrically reoriented surface, and having a plurality of micro-tubes disposed therein;
 a heat transfer fluid contained within the plurality of micro-tubes;
 a second section of the geometrically reoriented heat pipe surface being disposed in a position geometrically offset from the first section and having a plurality of micro-tubes disposed therein and in flow communication with the micro-tubes of the first section; and
 wherein the first section of the geometrically reoriented heat pipe surface is connected to the second section through a curved region therebetween.

2. The cooling system of claim 1, wherein the second section of the geometrically reoriented heat pipe surface extends substantially orthogonal to the first section.

3. The cooling system of claim 1, wherein the second section of the geometrically reoriented heat pipe surface extends from the first surface in a generally U-shaped configuration.

4. The cooling system of claim 1, wherein the second section of the geometrically reoriented heat pipe surface extends from the first section in a generally axially aligned, twisted relationship relative thereto.

5. The cooling system of claim 1, wherein the second section of the geometrically reoriented heat pipe surface extends from the first section in a generally parallel, axially offset position relative thereto.

6. The cooling system of claim 1, wherein the second section of the geometrically reoriented heat pipe surface is connected to a third section through a curved region therebetween.

7. The cooling system of claim 6, wherein the heat transfer fluid removes heat from the at least one heat generating component via an adiabatic process, wherein the heat transfer fluid is evaporated in the first section and condensed in the second section of the geometrically reoriented heat pipe surface to facilitate the removal of heat from the at least one heat generating component.

8. The cooling system of claim 1, wherein the plurality of micro-tubes further comprise an internal wick structure to facilitate heat removal via capillary action.

9. The cooling system of claim 8, wherein the wick structure is selected from the group consisting of internal fins, grooved inner sidewalls, and metal screens.

10. The cooling system of claim 1, wherein the heat transfer fluid is selected from the group consisting of water, glycol, and alcohol.

11. The cooling system of claim 1, wherein the cooling system is affixed to a printed circuit board for cooling the at least one heat generating component, and the printed circuit board is affixed in a notebook computer, wherein the cooling system is configured to conform to the shape and size of the notebook computer.

12. A cooling system for removing heat from at least one heat generating component, said cooling system comprising:
 a phase plane heat pipe having a first portion in thermal contact with the at least one heat generating component, the heat pipe having a second geometrically reoriented portion extending therefrom, and having a plurality of micro-tubes;

a heat transfer fluid contained within the plurality of micro-tubes, wherein the heat transfer fluid is evaporated in the first portion and condensed in the second portion to facilitate the removal of heat; and wherein the first portion of the heat pipe is connected to the second portion through a curved region therebetween.

13. The cooling system of claim 12, wherein the second portion of the heat pipe extends from the first portion in a generally U-shaped configuration.

14. The cooling system of claim 12, wherein the second portion of the heat pipe extends from the first portion in a generally axially aligned twisted configuration.

15. The cooling system of claim 12, wherein the second portion of the heat pipe extends from the first portion in a generally parallel, axially disposed position.

16. The cooling system of claim 12, wherein the second portion of the heat pipe extends from the first portion along an axis generally orthogonal thereto, wherein the heat pipe forms a generally L-shaped configuration.

17. The cooling system of claim 12, wherein the heat pipe further includes an array of cooling fins in thermal contact with at least one surface thereof and a thermally conductive spacer block is disposed between the heat pipe and the at least one heat generating component.

18. The cooling system of claim 12, wherein the plurality of micro-tubes comprise an internal wick structure to facilitate heat removal from the at least one heat generated component via capillary action.

19. The cooling system of claim 18, wherein the internal wick structure is selected from the group consisting of internal fins, grooved inner sidewalls, and metal screens.

20. The cooling system of claim 12, wherein the heat transfer fluid is selected from the group consisting of air, water, glycol, and alcohol.

21. The cooling system of claim 12, wherein the cooling system is affixed to a printed circuit board for cooling the at least one heat generating component, and the printed circuit board is affixed to a notebook computer, wherein the cooling system is configured to conform to the shape and size of the notebook computer and the first and second portions of the heat pipe are geometrically reoriented one to the other to provide a thermal transfer therein to effect the cooling of the at least one heat generating component.

* * * * *